United States Patent
Chen et al.

(10) Patent No.: US 9,779,810 B2
(45) Date of Patent: Oct. 3, 2017

(54) ADJUSTABLE WRITING CIRCUIT

(71) Applicants: MACRONIX INTERNATIONAL CO., LTD., Hsinchu (TW); INTERNATIONAL BUSINESS MACHINES CORPORATION, Armonk, NY (US)

(72) Inventors: Chia-Jung Chen, Hsinchu (TW); Scott C. Lewis, Eastham, MA (US)

(73) Assignees: MACRONIX INTERNATIONAL CO., LTD., Hsinchu (TW); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/052,388

(22) Filed: Feb. 24, 2016

(65) Prior Publication Data
US 2017/0076795 A1 Mar. 16, 2017

Related U.S. Application Data

(60) Provisional application No. 62/217,053, filed on Sep. 11, 2015.

(51) Int. Cl.
*G11C 13/00* (2006.01)
(52) U.S. Cl.
CPC ...... *G11C 13/0069* (2013.01); *G11C 13/0004* (2013.01); *G11C 13/0038* (2013.01); *G11C 2013/0092* (2013.01)

(58) Field of Classification Search
USPC .................................................. 365/163, 148
See application file for complete search history.

(56) References Cited

U.S. PATENT DOCUMENTS

| | | |
|---|---|---|
| 3,922,648 A | 11/1975 | Buckley |
| 4,225,946 A | 9/1980 | Neale et al. |
| 4,228,524 A | 10/1980 | Neale et al. |
| 6,762,952 B2 | 7/2004 | Munden et al. |
| 6,768,665 B2 | 7/2004 | Parkinson et al. |
| 6,781,906 B2 | 8/2004 | Perner et al. |
| 6,928,022 B2 | 8/2005 | Cho et al. |
| 7,085,154 B2 | 8/2006 | Cho et al. |
| 7,190,607 B2 | 3/2007 | Cho et al. |
| 7,289,351 B1 | 10/2007 | Chen et al. |
| 7,362,610 B1 * | 4/2008 | Salter, III ......... G11C 16/3418 365/185.02 |
| 7,505,330 B2 | 3/2009 | Pawlowski et al. |
| 7,539,050 B2 | 5/2009 | Philipp et al. |

(Continued)

*Primary Examiner* — Hoai V Ho
*Assistant Examiner* — Minh Dinh
(74) *Attorney, Agent, or Firm* — Haynes Beffel & Wolfeld LLP

(57) ABSTRACT

A write pulse driver is provided. The write pulse driver includes a parameter storage, storing a set of parameters specifying characteristics of a write pulse, and driver circuitry configured to generate the write pulse on an output node, the write pulse having a leading edge, a trailing edge and an intermediate segment between the leading edge and the trailing edge, wherein the driver circuitry includes pulse shaping circuits that set shape characteristics of at least one of an amplitude, a duration and a slope of more than one of the leading edge, the trailing edge and the intermediate segment of the write pulse using the set of parameters.

18 Claims, 20 Drawing Sheets

(56) References Cited

U.S. PATENT DOCUMENTS

| | | | |
|---|---|---|---|
| 7,558,105 B2 | 7/2009 | Suh | |
| 7,571,901 B2 | 8/2009 | Philipp | |
| 7,577,024 B2 | 8/2009 | Fackenthal et al. | |
| 7,580,277 B2 | 8/2009 | Fuji | |
| 7,656,701 B2 | 2/2010 | Lee et al. | |
| 7,679,954 B2 | 3/2010 | Lee et al. | |
| 7,751,227 B2 | 7/2010 | Fuji | |
| 7,751,233 B2 | 7/2010 | Kang et al. | |
| 7,764,533 B2 | 7/2010 | Breitwisch et al. | |
| 7,767,993 B2 | 8/2010 | Toda et al. | |
| 7,796,424 B2 | 9/2010 | Happ et al. | |
| 7,826,248 B2 | 11/2010 | Xi et al. | |
| 7,830,701 B2 | 11/2010 | Siau et al. | |
| 8,611,135 B2 * | 12/2013 | Wang .................. | G11C 11/5678 365/148 |
| 8,897,058 B2 | 11/2014 | Ahn | |
| 2005/0275433 A1 | 12/2005 | Lee | |
| 2006/0034112 A1 | 2/2006 | Oh et al. | |
| 2007/0140029 A1 | 6/2007 | Kim et al. | |
| 2009/0273968 A1 | 11/2009 | Lamorey et al. | |
| 2009/0296450 A1 | 12/2009 | Sheu et al. | |
| 2010/0214829 A1 | 8/2010 | Breitwisch et al. | |
| 2010/0328995 A1 | 12/2010 | Shih et al. | |
| 2011/0013446 A1 | 1/2011 | Lung | |
| 2011/0116309 A1 | 5/2011 | Lung | |
| 2012/0250403 A1 * | 10/2012 | Wang .................. | G11C 11/5678 365/163 |

* cited by examiner

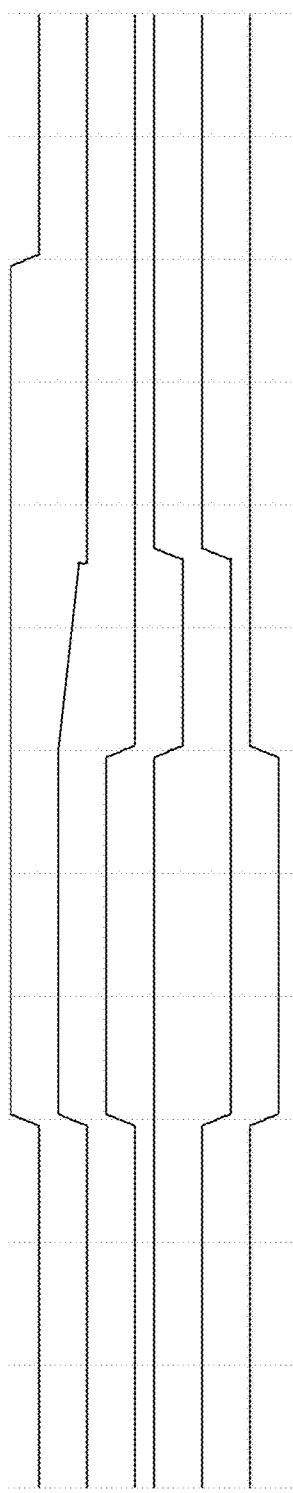

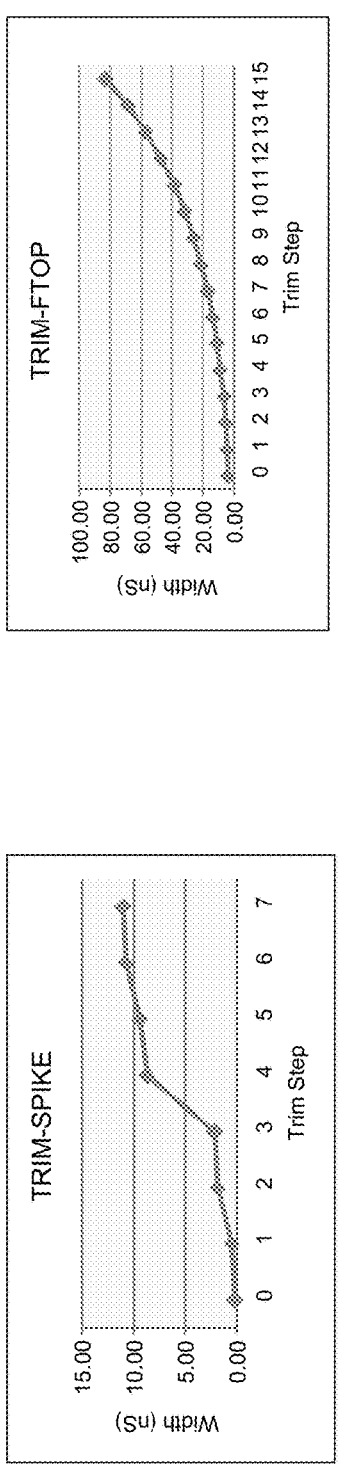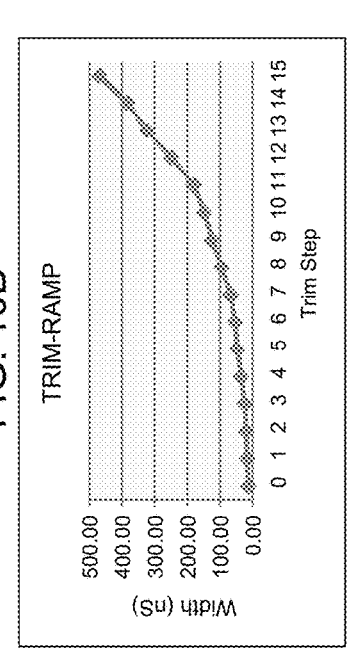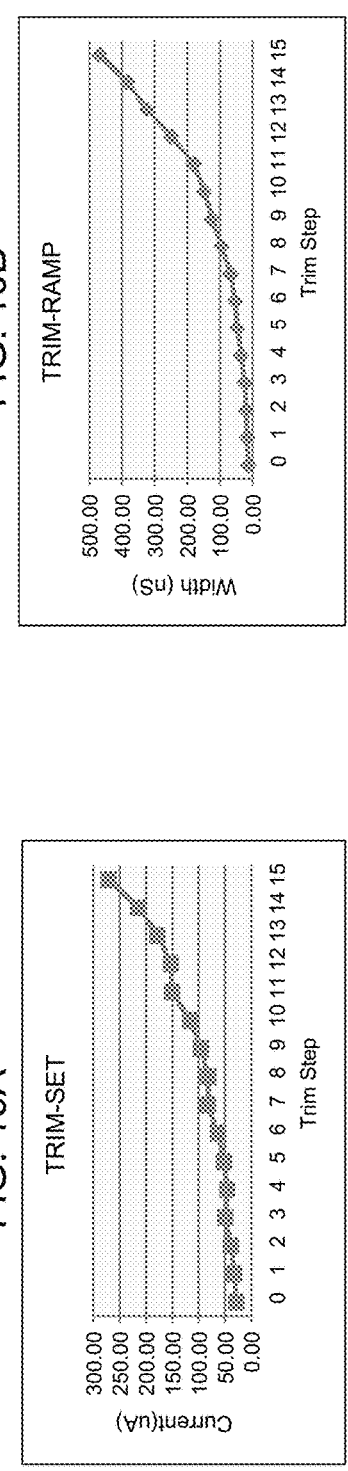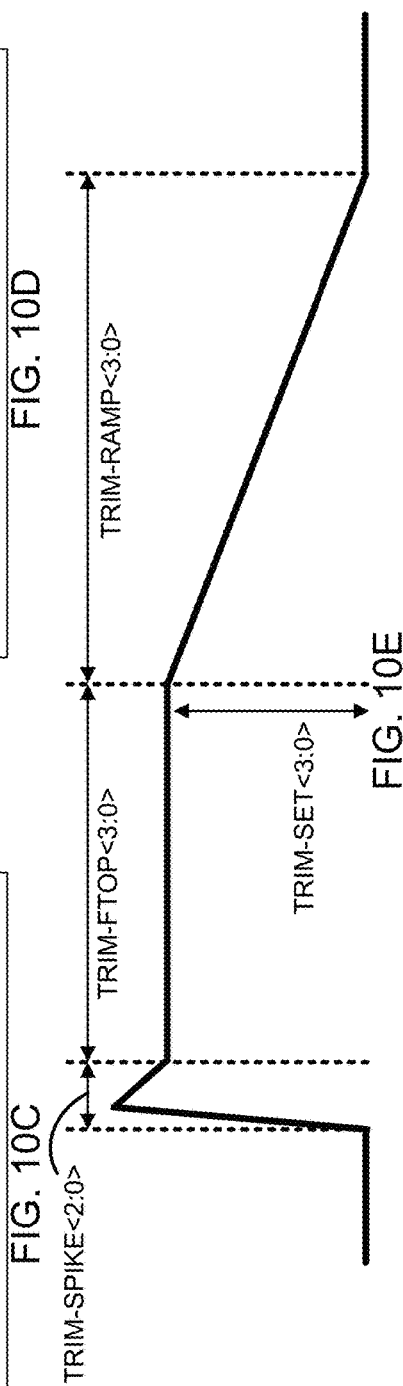

ized by higher electrical resistivity than the crystalline phase. In operation of the phase change memory element, an electrical current pulse passed through the memory cell of the PCM can set or reset the resistivity phase of the phase change memory element (i.e., the electrical current pulse can be used to change the PCM between the amorphous phase and the crystalline phase).

ADJUSTABLE WRITING CIRCUIT

RELATED APPLICATIONS

This application claims the benefit of U.S. Provisional Patent Application No. 62/217,053 filed on 11 Sep. 2015, which is incorporated by reference as if fully set forth herein.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND

Technological Field

The present technology relates to an adjustable writing circuit, such as a write pulse driver, for writing to memory devices, and methods for manufacturing and operating such devices. Specifically, the present technology relates to an adjustable writing circuit for writing data to a bitline of a memory comprised of phase change materials, and methods for manufacturing and operating such devices.

Description of Related Art

In a phase change memory (PCM), each memory cell includes a phase change memory element. The phase change memory element can be caused to change phase between a crystalline phase and an amorphous phase. The amorphous phase is character- The change from the amorphous phase to the crystalline phase, referred to herein as the SET operation, may be performed by applying an electrical pulse through the phase change material. In the electrical pulse, an initial peak current is followed by decreasing current over the duration of the pulse so that the phase change material slowly cools into the crystalline phase.

The change from the crystalline phase to the amorphous phase, referred to herein as the RESET operation, may be performed by applying a short high current electrical pulse through the phase change material to melt or break down the crystalline phase structure in the phase change material. Afterwards the phase change material cools quickly, quenching the phase change process and allowing at least a portion of the phase change material to stabilize in the amorphous phase.

PCM has the advantageous properties of scalability, dynamic random access memory (DRAM)-like operation and non-volatility, which make it a good candidate for storage class memory. However, PCM may be comprised of different combinations/compositions of germanium (Ge), antimony (Sb) and tellurium (Te), sometimes referred to as GST and may be used in different types of applications. These different combinations/compositions of GST and varying applications may require and/or perform optimally under different writing operations. For example, the timing, duration and levels of the signals required to perform the SET and RESET operations can vary depending upon the GST combinations/compositions of the PCM and depending upon the application/use of the PCM.

It is therefore desirable to provide a circuit that can adjustably write to a PCM based on the composition and the application/use of the PCM. Accordingly, proposed solutions are provided to implement an adjustable writing circuit for PCM, as well as multi-level cell (MLC) technology materials, other types of non-volatile memory, general memory and/or general semiconductor devices in order to improve the performance and/or reliability of the various types of memory (e.g., PCM) based on specific application/use of the memory and the type of the memory.

SUMMARY OF THE INVENTION

A write pulse driver, a memory device, a method of controlling the write pulse driver, a method of controlling the memory device, and a method of controlling a write pulse driver are described herein.

The write pulse driver includes a parameter storage, storing a set of parameters specifying characteristics of a write pulse, and driver circuitry configured to generate the write pulse on an output node, the write pulse having a leading edge, a trailing edge and an intermediate segment between the leading edge and the trailing edge, wherein the driver circuitry includes pulse shaping circuits that set shape characteristics of at least one of an amplitude, a duration and a slope of more than one of the leading edge, the trailing edge and the intermediate segment of the write pulse using the set of parameters.

The memory device can include a first block of memory cells and a second block of memory cells and a parameter storage, storing a first set of parameters specifying characteristics of a first write pulse for the first block and a second set of parameters specifying characteristics of a second write pulse for the second block. Further, the memory device can include driver circuitry configured to generate the first and second write pulses on output nodes coupled to bit lines in the first and second blocks, respectively, each of the first and second write pulses having a leading edge, a trailing edge and an intermediate segment between the leading edge and the trailing edge, wherein the driver circuitry includes circuits that determine characteristics of one or more of the leading edge, the trailing edge and the intermediate segment of first write pulse applied to the bit lines in the first block using the first set of parameters, and wherein the driver circuitry includes circuits that determine characteristics of one or more of the leading edge, the trailing edge and the intermediate segment of the second write pulse applied to the bit lines in the second block using the second set of parameters.

The method of controlling a write pulse driver (including a parameter storage storing a set of parameters specifying characteristics of a write pulse and including driver circuitry including an output node, the driver circuitry being configured to generate the write pulse on the output node, the write pulse having a leading edge, a trailing edge and an intermediate segment between the leading edge and the trailing edge) includes obtaining the set of parameters from the parameter storage, setting shape characteristics of at least one of an amplitude, a duration and a slope of more than one of the leading edge, the trailing edge and the intermediate segment of the write pulse using the obtained set of parameters, and generating the write pulse on the output node using the set shape characteristics of the at least one of the amplitude, the duration and the slope of the more than one of the leading edge, the trailing edge and the intermediate segment.

A method of controlling a memory device which can include first and second blocks of memory cells, including a parameter store storing first and second sets of parameters, and including driver circuitry including an output node coupled to bit lines in the first and second blocks, is described that includes obtaining, from the parameter store, the first set of parameters specifying characteristics of a first write pulse for the first block, the first write pulse having a leading edge, a trailing edge and an intermediate segment between the leading edge and the trailing edge, obtaining, from the parameter store, the second set of parameters specifying characteristics of a second write pulse for the second block, the second write pulse having a leading edge, a trailing edge and an intermediate segment between the leading edge and the trailing edge, and determining characteristics of more than one of the leading edge, the trailing edge and the intermediate segment of the first write pulse applied to a bit line in the first block using the obtained first set of parameters. Further, the method includes determining characteristics of more than one of the leading edge, the trailing edge and the intermediate segment of the second write pulse applied to a bit lines in the second block using the obtained second set of parameters, generating the first write pulse on the output node using the determined characteristics of the more than one of the leading edge, the trailing edge and the intermediate segment, and generating a second write pulse on the output node using the determined characteristics of the more than one of the leading edge, the trailing edge and the intermediate segment.

Other features, combinations of features, aspects and advantages of the technology described herein can be seen in the drawings, the detailed description and the claims, which follow.

BRIEF DESCRIPTION OF THE DRAWINGS

FIG. 8C illustrates a timing waveform of signals (e.g., SET-IN, SHAPE0, RTOP, bRAMP, STOP and bRT) in relation to the timing shape generate circuit 804 of FIG. 8A.

FIGS. 10A-10E are charts illustrating various simulation results of a SET operation as adjusted by an adjustable writing circuit, according to various embodiments of the present disclosure.

DETAILED DESCRIPTION

A detailed description of embodiments of the technology is provided with reference to the FIGS. 1A-16.

Figure 1A:
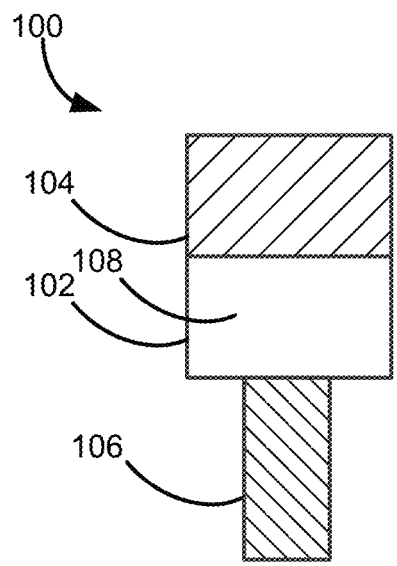
FIG. 1A is a schematic of a portion of a memory cell in a SET phase, according to an embodiment of the present disclosure.
Figure 1B:
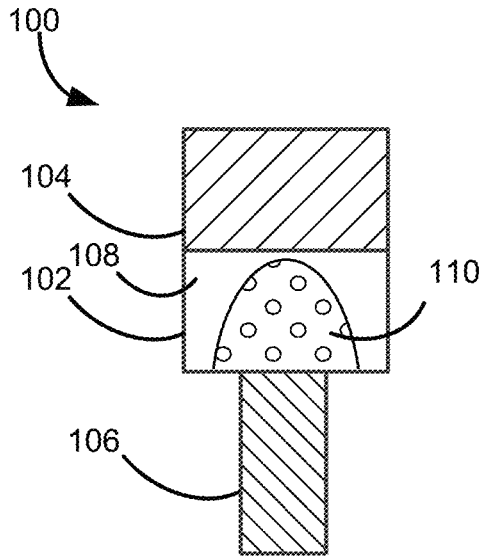
FIG. 1B is a schematic of a portion of a memory cell in a RESET phase, according to an embodiment of the present disclosure.

FIGS. 1A and 1B illustrate schematics of portions of a memory cell in a SET phase and a RESET phase, respectively, in accordance with various embodiments of the present disclosure.

Referring to each of FIGS. 1A and 1B, a memory cell 100 includes a memory element 102 located between a top electrode 104 and a bottom electrode 106. The memory element 102 includes a layer of a phase change material. The phase change material may change between an amorphous phase (see FIG. 1B) and a crystalline phase (see FIG. 1A).

Embodiments of the memory cell 100 include phase change based memory materials, including chalcogenide based materials (e.g., chalcogens) and other materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

The portion of the memory cell 100 shown in FIG. 1A is in the SET phase where the phase change material of the memory element 102 is in the crystalline phase 108.

The portion of the memory cell 100 shown in FIG. 1B is in the RESET phase where the phase change material of the memory element 102 includes a large portion stabilized in the amorphous phase 110 in the current path between the top electrode 104 and bottom electrode 106 and also includes portions in the crystalline phase 108. A current applied through the top and bottom electrodes 104 and 106 of the memory cell 100 can cause heating of the memory element 102 which allows a change between the SET and RESET phases to occur.

Figure 2:
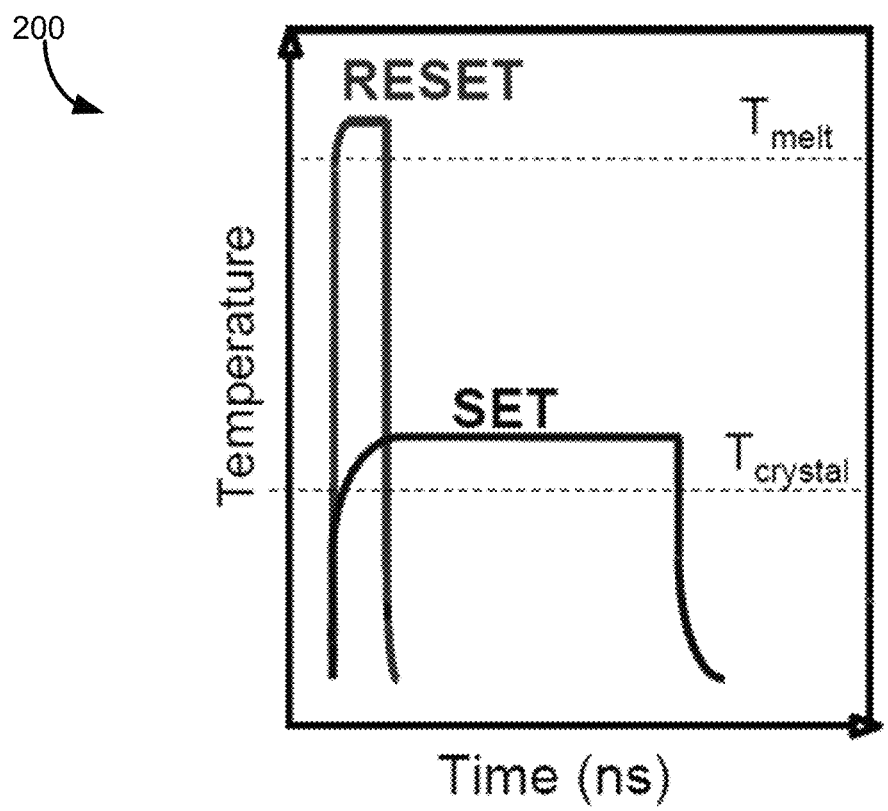
FIG. 2 is a chart illustrating a relationship between temperature and time for RESET and SET phases of a memory cell, according to an embodiment of the present disclosure.

FIG. 2 is a chart illustrating a relationship between temperature and time for the RESET, and SET phases of a memory cell, according to an embodiment of the present disclosure.

Referring to FIG. 2, a chart 200 illustrates that in order to place the PCM in the RESET phase, the temperature must exceed a specific threshold $T_{melt}$ for a specific amount of time, typically measured in nanoseconds (ns). To place the PCM in the RESET phase, the temperature must be high enough to place the PCM in the amorphous phase (as opposed to the crystalline phase), as described above with reference to FIG. 1B. This can be achieved by applying a short high current pulse through the phase change material to melt or break down the crystalline phase structure in the phase change material. Afterwards the phase change material cools quickly, quenching the phase change process and allowing at least a portion of the phase change material to stabilize in the amorphous phase.

Further, the chart 200 illustrates that to place the PCM in the SET phase, the temperature of the PCM must exceed a specific threshold $T_{crystal}$ for a specific amount of time, yet remain below the temperature threshold $T_{melt}$. This temperature change may be performed by applying an electrical pulse through the phase change material. In the electrical pulse, an initial peak current is followed by decreasing current over the duration of the pulse so that the phase change material slowly cools into the crystalline phase.

Figure 3:
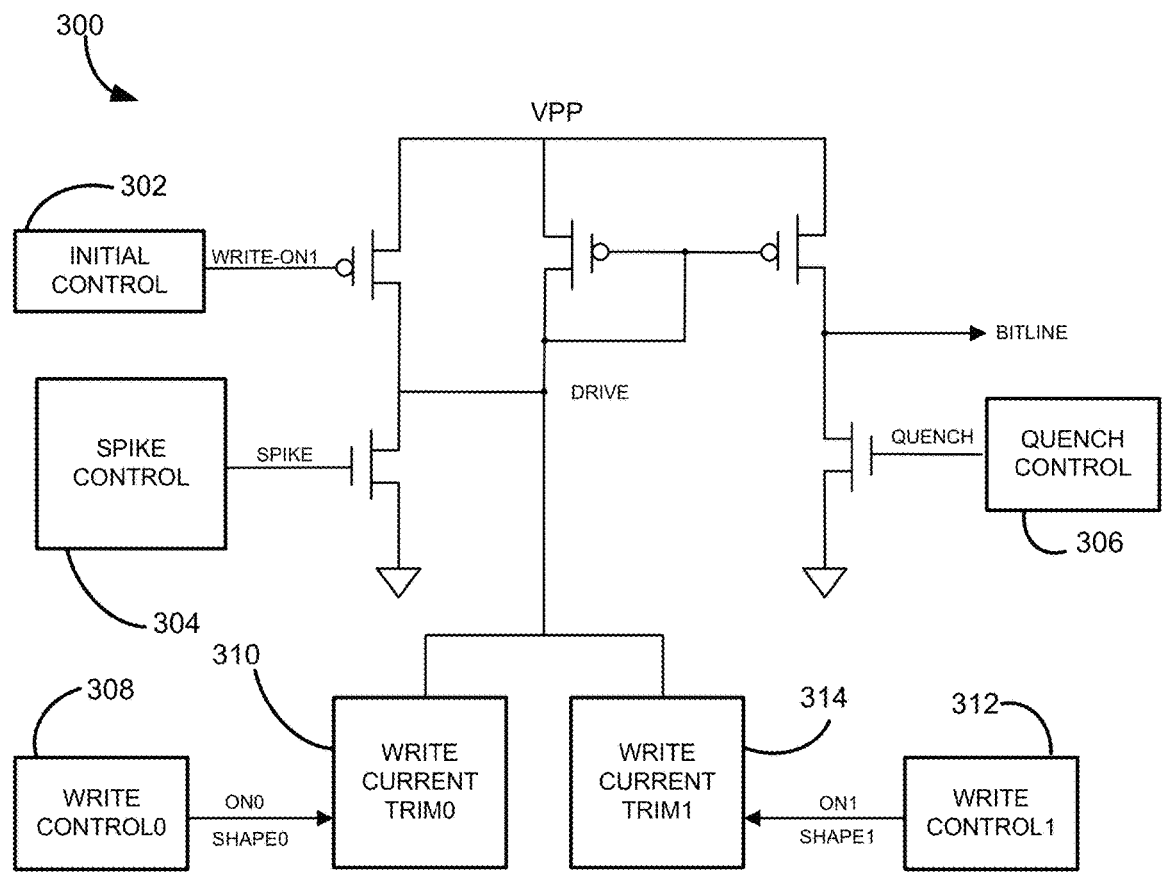
FIG. 3 is a block diagram illustrating various portions of the adjustable writing circuit, according to an embodiment of the present disclosure.

FIG. 3 is a block diagram illustrating various portions of the adjustable writing circuit, according to an embodiment of the present disclosure.

Referring to FIG. 3, a block diagram 300 representing an adjustable writing circuit (e.g., a write pulse driver) is illustrated. As illustrated, the adjustable writing circuit includes an initial control portion 302, a spike control portion 304, a quench control portion 306, a write control0 portion 308, a write current trim0 portion 310, a write control1 portion 312, a write current trim1 portion 314, a drive node and a connection to a bitline.

Figure 4A:
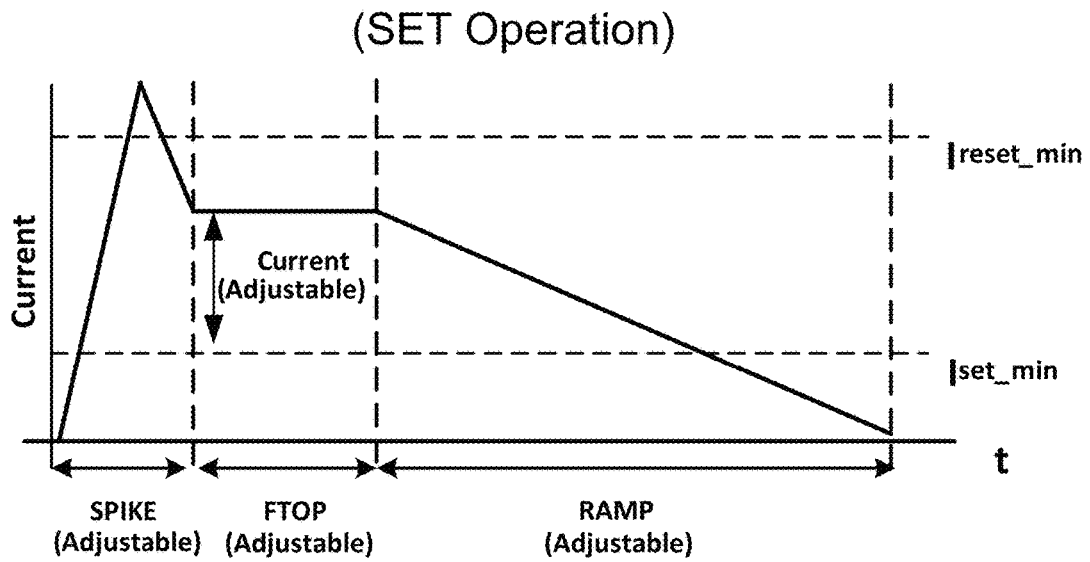
FIG. 4A is a chart illustrating a waveform generated during a SET operation, according to an embodiment of the present disclosure.
Figure 4B:
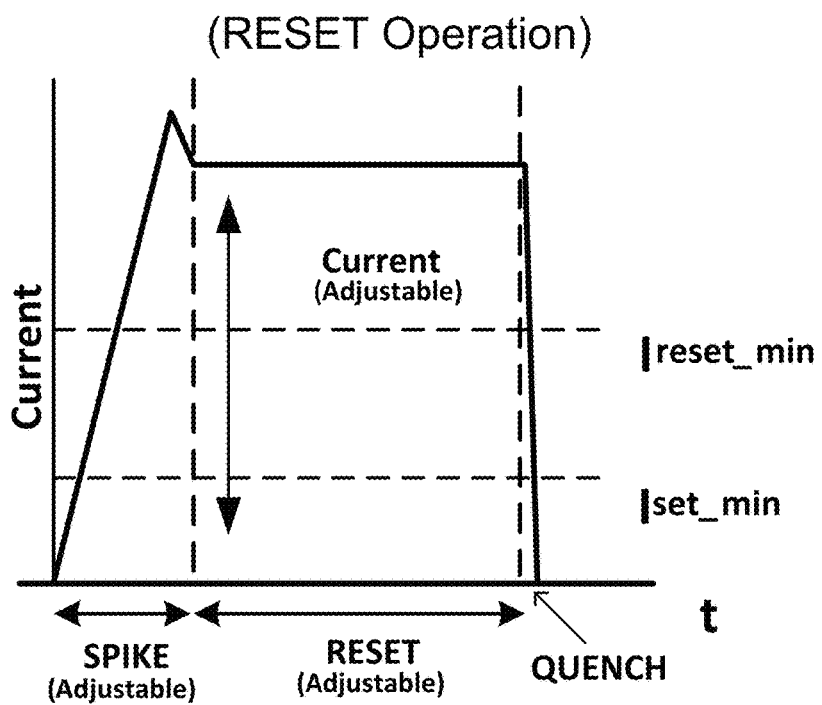
FIG. 4B is a chart illustrating a waveform generated during a RESET operation, according to an embodiment of the present disclosure.

As illustrated, a programming voltage (VPP) is supplied to the adjustable writing circuit. Using the VPP, each of the various portions 302, 304, 306, 308, 310, 312 and 314 is capable of controlling a waveform (e.g., a write pulse) output from the adjustable writing circuit to a bitline of a PCM. In an implementation, the waveform includes a pulse having a leading edge, a trailing edge and an intermediate segment between the leading edge and the trailing edge. Examples of the waveform are illustrated in FIGS. 4A and 4B. As described below is further detail shape characteristics, such as at least one of an amplitude, a duration and a slope of one or more of the leading edge, the trailing edge and the intermediate segment of the waveform can be set by various circuits (e.g., pulse shaping circuits) using stored parameters.

With respect to the adjustable writing circuit, the initial control portion 302 is configured to control a timing for an initial bias on the drive node by outputting a WRITE-ON1 signal.

The spike control portion 304 is configured to control a timing of the leading edge (e.g., a SPIKE portion) of the waveform output from the adjustable writing circuit to the bitline of the PCM during both the SET operation and the RESET operation. By controlling the timing of the SPIKE portion of the waveform, it is possible to decrease a pre-charge time of the bitline and it is possible to have the flexibility to melt the phase change material of the PCM before the intermediate segment (e.g., a flat top (FTOP) portion) of the waveform of the SET operation. These features and flexibility allow for increased performance and/or reliability of the PCM.

The quench control portion 306 is configured to adjust a timing of pulling down the current of the waveform output from the adjustable writing circuit to the bitline of the PCM. This is done using a QUENCH signal, as output/controlled from/by the quench control portion 306. During the RESET operation, it is important to quickly quench the temperature of the phase change material, so as to ensure that the phase change material stabilizes in the amorphous phase. This can be done by quickly reducing the current applied to the bitline of the PCM using the QUENCH signal.

The write current trim0 portion 310 is configured to adjust a current value of the waveform output from the adjustable writing circuit during the SET operation and the write current trim1 portion 314 is configured to adjust a current value of the waveform output from the adjustable writing circuit during the RESET operation.

The write control0 portion 308 controls an on/off state of the write current trim0 portion 310 by outputting an ON0 signal and generates a voltage based SHAPE0 signal (including a flat top (FTOP) portion and a ramp down portion, as illustrated in FIG. 8C discussed below) during the SET operation. Specifically, the SHAPE0 signal adjusts a duration of the FTOP portion (e.g., the intermediate segment) and the ramp down portion (e.g., the trailing edge) of the waveform during the SET operation.

Figure 9A:
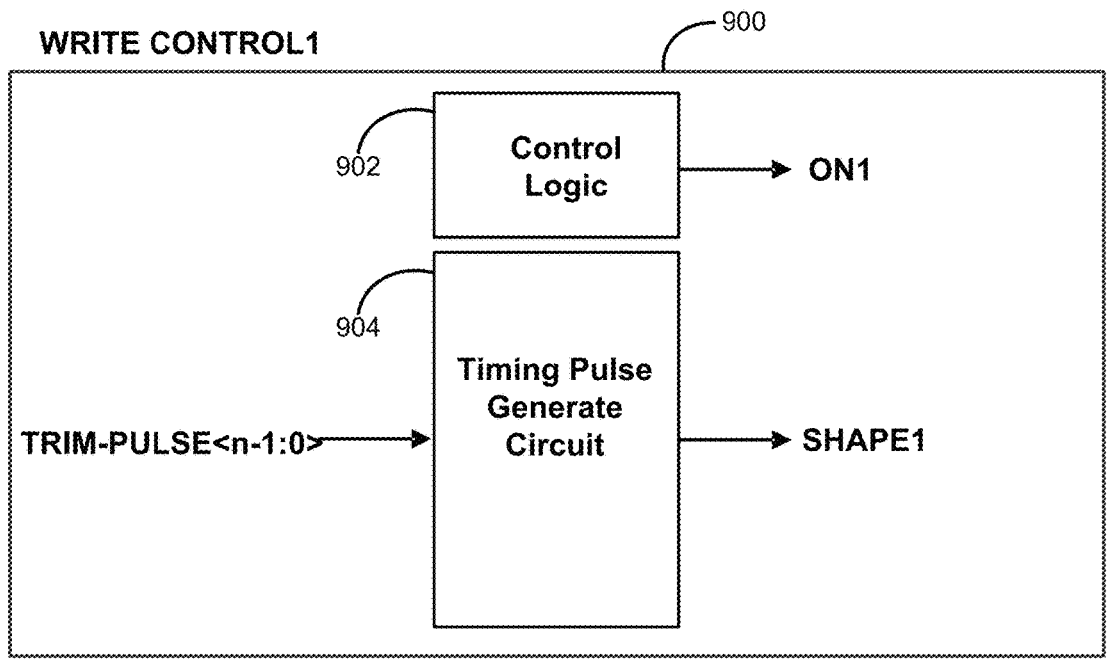
FIG. 9A is a block diagram illustrating features of a write control1 portion of an adjustable writing circuit, according to an embodiment of the present disclosure.
Figure 9B:
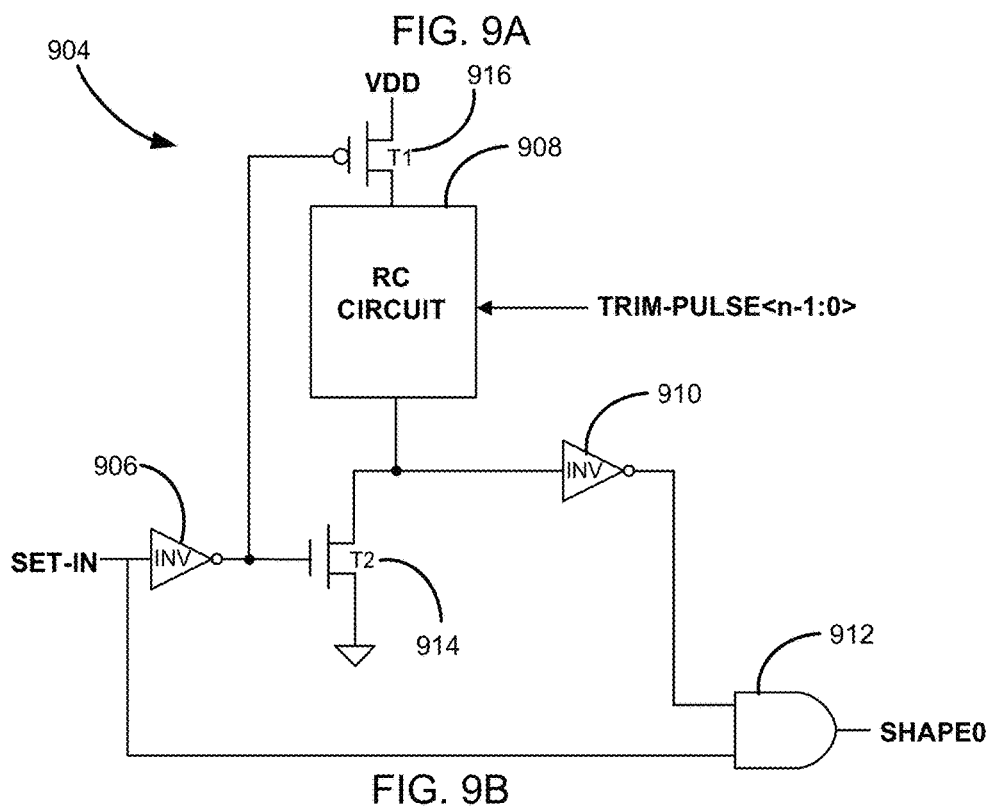
FIG. 9B illustrates an exemplary circuit schematic of the timing pulse generate circuit 904 of FIG. 9A.
Figure 9C:
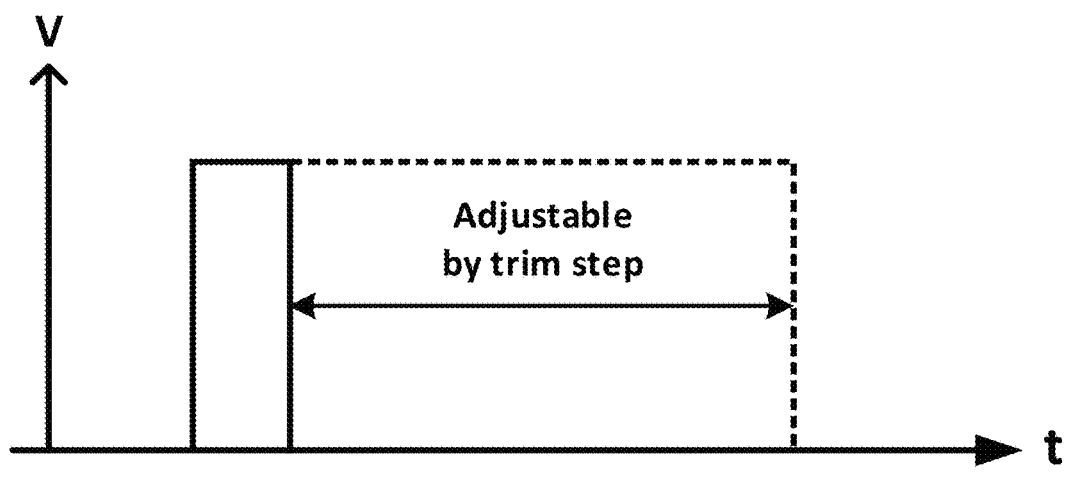
FIG. 9C is a chart illustrating an adjustability of a waveform output as SHAPE1, according to an embodiment of the present disclosure.

The write control1 portion 312 controls an on/off state of the write current trim1 portion 314 by outputting an ON1 signal and generates a voltage based SHAPE1 signal (e.g., a timing pulse) as illustrated in FIG. 9C discussed below. Specifically, the SHAPE1 signal adjusts a duration of a RESET portion (e.g., the intermediate segment) of the waveform during the RESET operation.

The write current trim0 portion 310 receives the SHAPE0 signal, and based on the received SHAPE0 signal, the write current trim0 portion 310 controls and adjusts a current of the FTOP portion of the waveform output from the adjustable writing circuit during the SET operation (e.g., adjusts the amount of current during the FTOP portion).

By the write control0 portion 308 and the write current trim0 portion 310 adjusting the time and shape of the FTOP portion and the ramp down portion during the SET operation, it is possible to speed up the SET operation, leading to improved performance of the PCM.

The write current trim1 portion 314 receives the SHAPE1 signal, and based on the received SHAPE1 signal, the write current trim portion 314 controls and adjusts a current of the RESET portion of the waveform during the RESET operation (e.g., adjusts the amount of the current during the RESET portion).

Each of the various portions 302, 304, 306, 308, 310, 312 and 314 of the adjustable writing circuit can be individually controlled to adjust the output to the bitline of the PCM during various portions of the waveform generated during the SET and RESET operations. The various portions of the waveform and how they are adjusted during the SET and RESET operations are discussed in more detail with reference to FIGS. 4A and 4B below.

FIG. 4A is a chart illustrating a waveform generated during a SET operation, according to an embodiment of the present disclosure.

Referring to FIG. 4A, a waveform illustrating current vs. time for a SET operation is provided. As illustrated, the waveform includes a SPIKE portion (e.g., the leading edge as discussed above), an FTOP portion (e.g., the intermediate segment, as discussed above) and a RAMP portion (e.g., the trailing edge, as discussed above).

With reference to FIGS. 3 and 4A, the spike control portion 304 adjusts a timing/duration of the SPIKE portion of the waveform. During the SPIKE portion of the SET operation, the current should briefly rise above an $I_{reset\_min}$ threshold, and then drop below the $I_{reset\_min}$ threshold in order to sufficiently raise the temperature of the PCM to place the PCM in the crystalline phase.

Further, the write current trim0 portion 310 of FIG. 3 adjusts the amount of the current during the FTOP portion of the waveform during the SET operation and the write control0 portion 308 adjusts the duration of the FTOP portion of the waveform during the SET operation. During the FTOP phase of the SET operation, the waveform should maintain a current below the $I_{reset\_min}$ threshold and above an $I_{set\_min}$ threshold.

Additionally, the write control0 portion 308 is configured to adjust the duration/slope of the ramp down during the RAMP portion of the waveform. During the RAMP portion of the waveform, the current is ramped down below the $I_{set\_min}$ threshold.

FIG. 4B is a chart illustrating a waveform generated during a RESET operation, according to an embodiment of the present disclosure.

Referring to FIG. 4B, a waveform illustrating current vs. time for a RESET operation is provided. As illustrated, the waveform includes a SPIKE portion (e.g., the leading edge, as discussed above), a RESET portion (e.g., the intermediate segment, as discussed above), and a QUENCH portion (e.g., the trailing edge, as discussed above).

With reference to FIGS. 3 and 4B, the spike control portion 304 adjusts the timing/duration of the SPIKE portion of the waveform. During the SPIKE portion of the RESET operation, the current should rise and be maintained above an $I_{reset\_min}$ threshold. Unlike the SPIKE portion of the waveform during the SET operation, the current during the SPIKE portion of the waveform during the RESET operation should not drop below the $I_{reset\_min}$ threshold. This extended duration of the current being maintained above the $I_{reset\_min}$ threshold in necessary in order to put the PCM in the amorphous phase.

The write current trim1 portion 314 adjusts the amount of current during the RESET portion of the waveform during the RESET operation. Further, the write control1 portion 312 of FIG. 3 adjusts the duration of the RESET portion of the waveform during the RESET operation. During the RESET portion of the waveform of the RESET operation, the waveform should maintain a current above the $I_{reset\_min}$ threshold in order to sufficiently increase the temperature of the PCM, so as to place the PCM in a melting phase and eventually the amorphous phase.

Also, the quench control portion 306 controls a timing of the waveform during an end of the RESET operation, so to quickly drop the current from above the $I_{reset\_min}$ threshold to below the $I_{set\_min}$ threshold. This quench quickly cools the temperature of the PCM to place the PCM in the amorphous phase.

Figure 5:
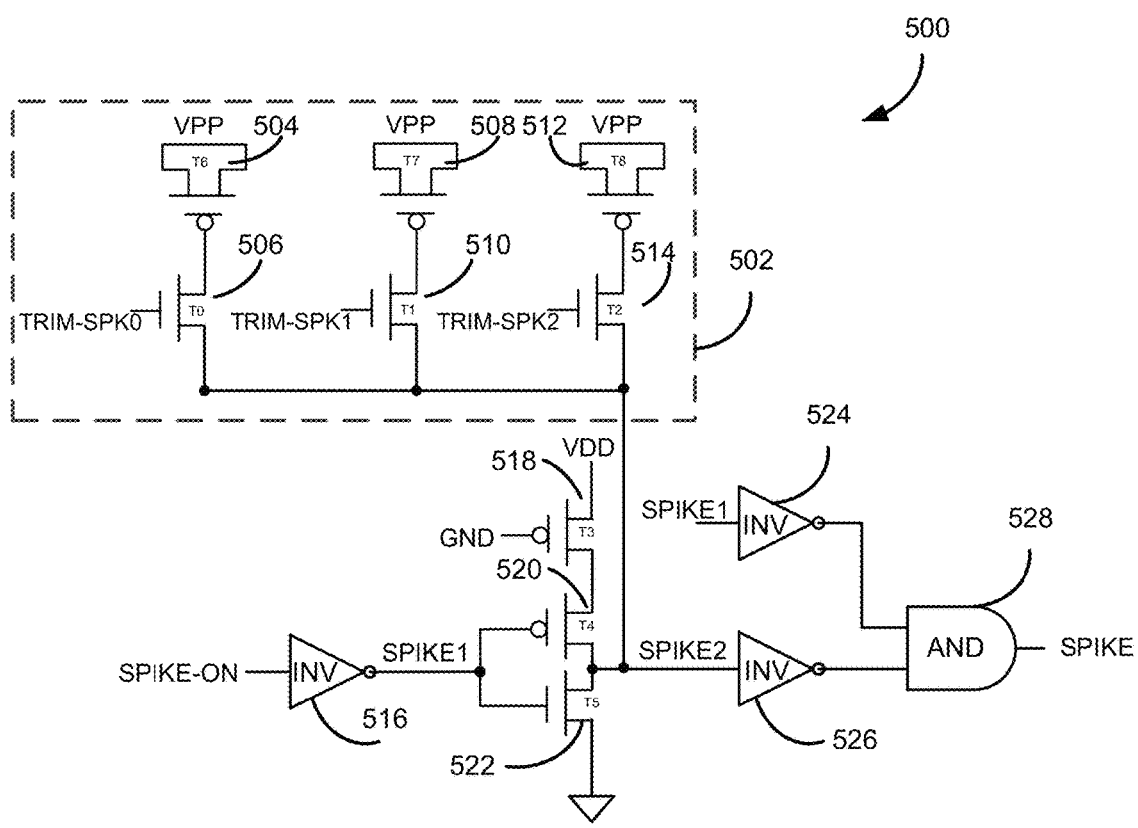
FIG. 5 is a schematic of a spike control portion of an adjustable writing circuit, according to an embodiment of the present disclosure.

FIG. 5 is a schematic of a spike control portion of an adjustable writing circuit, according to an embodiment of the present disclosure.

Referring to FIG. 5, a block diagram 500 is illustrated, wherein the block diagram 500 includes circuitry of the spike control portion 304, as illustrated in FIG. 3. In an embodiment, the block diagram 500 includes a trim portion 502, which is capable of controlling, for example, 8 trim steps. The trim portion 502 is not limited to 8 trim steps, and can provide $2^n$ trim steps, represented by TRIM-SPK<n−1: 0>.

As illustrated in FIG. 5, the trim portion 502 includes 3 transistor pairs arranged in parallel. Specifically, transistors T0 506 and T6 504 are in parallel with transistors T1 510 and T7 508, which are in parallel with transistors T2 514 and T8 512. The gates of transistors T0 506, T1 510 and T2 514 are arranged to receive trim spike signals TRIM-SPK0, TRIM-SPK1, and TRIM-SPK2, respectively.

The source and drain of each of transistors T6 504, T7 508 and T8 512 are connected to VPP, causing transistors T6 504, T7 508 and T8 512 to act as metal-oxide semiconductor (MOS) capacitors. As trim spike signals TRIM-SPK0, TRIM-SPK1, and TRIM-SPK2 are turned on/off, the trim portion 502 will adjust the voltage of SPIKE2 signal accordingly. The voltage of the SPIKE2 signal will control how quickly the initial voltage spike, as illustrated in FIGS. 4A and 4B will be pulled down.

A SPIKE-ON signal, as received by inverter 516 is used to turn the circuitry of block diagram 500 (e.g., the spike control portion 304 as illustrated in FIG. 3) on and off. Specifically, when SPIKE-ON is high, the inverter 516 will cause transistor T4 520 to be on and transistor T5 522 to be off. Alternatively, when SPIKE-ON is low, the inverter 516 will cause transistor T4 520 to be off and transistor T5 522 to be on. The gate of transistor T3 518 is grounded to allow current to flow to transistor T4 520 as a result of the source of transistor T3 518 being connected to reference voltage (VDD).

When transistor T4 520 is on and transistor T5 522 is off, the SPIKE2 signal will essentially be VDD. The rate at which the SPIKE2 signal is pulled to VDD will be controlled by the output of the trim portion 502. When SPIKE2 is pulled to VDD, inverter 526 will cause AND gate 528 to transition to a low output and decrease the duration of the SPIKE portion of the waveform.

Accordingly, when the SPIKE-ON signal is low/off, transistor T4 520 is off and transistor T5 522 is on, causing the SPIKE2 signal to essentially be grounded and the SPIKE1 signal to be high. This basically causes the circuitry of block diagram 500 to be off as a result of AND gate 528 receiving a high signal from inverter 526 and receiving a low signal from inverter 524.

Further, when SPIKE-ON is high/on, AND gate 528 will receive a high input from inverter 524 and a low input from inverter 526, causing the SPIKE signal to be pulled low at a rate that is based on the trim spike signals TRIM-SPK0, TRIM-SPK1 and TRIM-SPK2, as discussed above.

An exemplary chart, TABLE 1, is provided below to illustrate the various phases of the signals and electrical components illustrated in FIG. 5.

TABLE 1

| SPIKE-ON | SPIKE1 | T4 | T5 | SPIKE2 | AND gate (inputs) | SPIKE |
|---|---|---|---|---|---|---|
| 1 | 0 | ON | OFF | VDD (rate at which VDD is applied is based on the output of the trim portion 502) | 1 × 0 (pulled to 0 at rate based on output of trim portion 502) | 0 (timing based on output of the trim portion 502) |
| 0 | 1 | OFF | ON | Ground | 0 × 1 | 0 (timing is not based on output of trim portion 502) |

Figure 6:
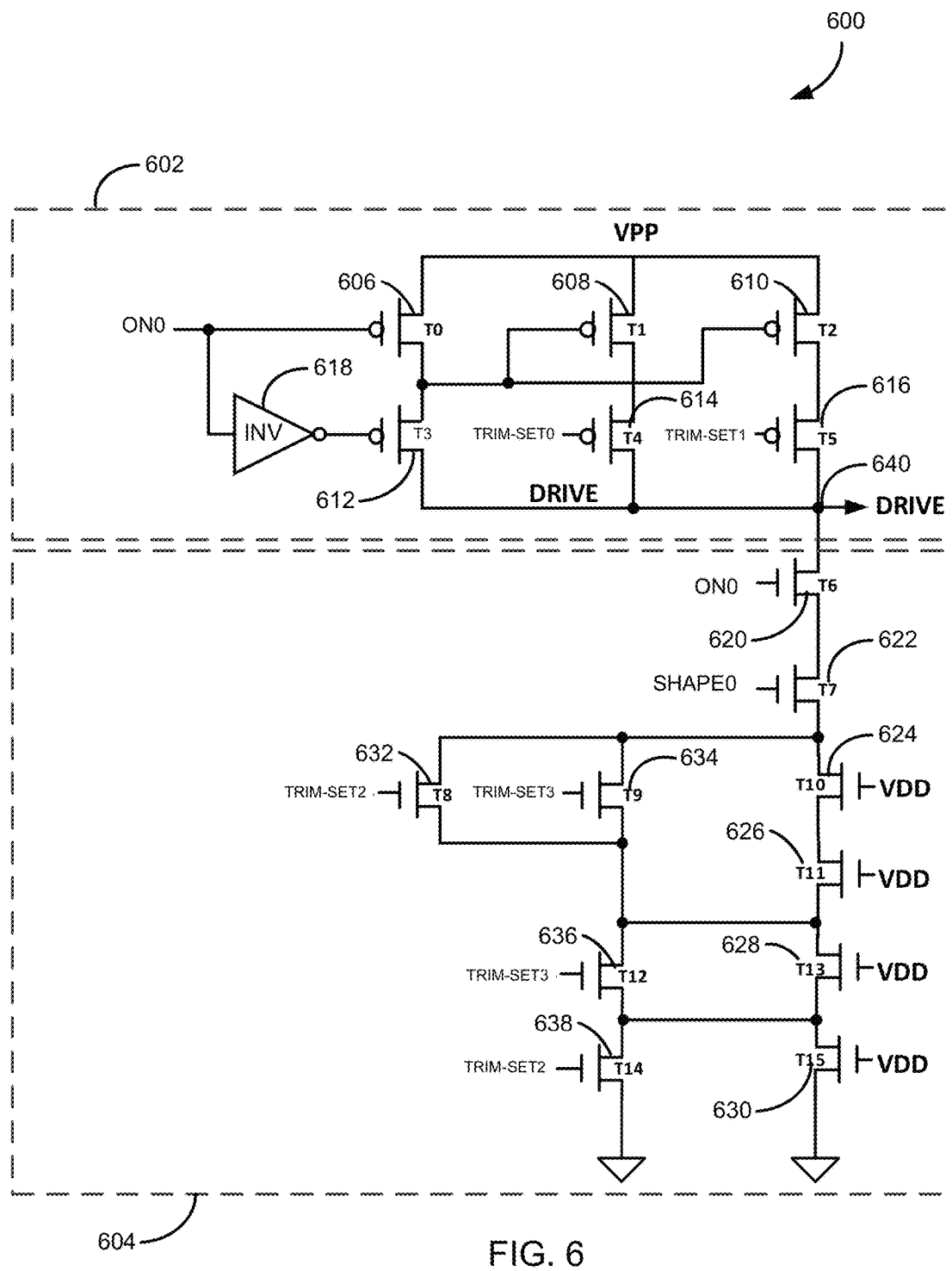
FIG. 6 is a schematic of a current trim0 portion of an adjustable writing circuit, according to an embodiment of the present disclosure.

FIG. 6 is a schematic of a current trim0 portion of an adjustable writing circuit, according to an embodiment of the present disclosure.

Referring to FIG. 6, a block diagram 600 of circuitry is provided. Specifically, the block diagram 600 is the circuitry of the write current trim0 portion 310, as illustrated in FIG. 3. The circuitry of block diagram 600 receives a SHAPE0 signal from the write control0 portion 308, as illustrated in FIG. 3.

As described above with reference to FIG. 3, the write current trim0 portion 310 adjusts the current of the FTOP portion (e.g., the intermediate segment, as discussed above) and the ramp down portion (e.g., the trailing edge, as discussed above) of the waveform (using a received voltage based signal SHAPE0) during the SET operation. This can be achieved, for example, by varying 3 parameters including node capacitance, a current source and a current multiplier at a DRIVE node 640 of the block diagram 600.

In an embodiment, the block diagram 600 includes portion 602 and portion 604 which are capable of controlling 16 trim steps. Portions 602 and 604 are not limited to 16 trim steps, and can provide $2^n$ trim steps, represented by TML<n−1:0>.

Portion 602 includes transistor T0 606, transistor T1 608, transistor T2 610, transistor T3 612, transistor T4 614, transistor T5 616 and inverter 618. Transistor T0 606 receives signal ON0 at the gate thereof and the inverter 618 also receives signal ON0. Signal ON0 turns the circuitry of block diagram 600 (i.e., write current trim0 portion 310) on and off.

Transistors T4 614 and T5 616 of portion 602 receive trim signals TRIM-SET0 and TRIM-SET1, respectively.

For example, when the signal ON0 is low/off, transistor T0 606 is on and transistor T3 612 is off, also causing transistors T1 608 and T2 610 to be off. This causes portion 602 of block diagram 600 to be off.

Alternatively, when signal ON0 is high/on, transistor T0 606 is off and transistors T3 612, T1 608 and T2 610 are on, which essentially causes portion 602 to be on. That is, when signal ON0 is high/on, portion 602 is on, allowing a trim current ratio to be adjusted by trim signals TRIM-SET0 and TRIM-SET1, which are received at the gates of transistors T4 614 and T5 616, respectively. For example, as the TRIM-SET0 and TRIM-SET1 signals decrease, transistors T4 614 and T5 616 turn on, causing a current provided at DRIVE 640 to become lower. In contrast, as TRIM-SET0 and TRIM-SET 1 signals increase, transistors T4 614 and T5 616 turn off, causing the current provided at DRIVE 640 to become higher.

An exemplary chart, TABLE 2, is provided below to illustrate the various phases of the signals and electrical components of portion 602 of block diagram 600 as illustrated in FIG. 6.

TABLE 2

| ON0 | T0 | T3 | T1 | T2 | DRIVE |
|---|---|---|---|---|---|
| 1 | OFF | ON | ON | ON | Trim current ratio adjusted based on trim signals TRIM-SET0 and TRIM-SET1 (as TRIM-SET0 and TRIM-SET1 decrease current at DRIVE 640 becomes lower and as TRIM-SET0 and TRIM-SET1 increase, current at DRIVE 640 becomes higher) |
| 0 | ON | OFF | OFF | OFF | 0 |

Specifically, when portion 602 is turned on, the trim signals TRIM-SET0 and TRIM-SET1 adjust the trim current ratio of the SHAPE0 signal received from the write control0 portion 308 (e.g., the amount of current during the FTOP and ramp portion is adjusted according to TRIM-SET0 and TRIM-SET1). When TRIM-SET0 and TRIM-SET1 are lower, T4 614 and T5 616 are on, enabling a current mirror to decrease the current provided at BITLINE of FIG. 3 As TRIM-SET0 and TRIM-SET1 increase, T4 614 and T5 616 turn to off, thus increasing the amount of current at BITLINE of FIG. 3.

Portion 604 includes transistor T6 620, transistor T7 622, transistor T10 624, transistor T11 626, transistor T13 628, transistor T15 630, transistor T8 632, transistor T9 634, transistor T12 636 and transistor T14 638. The gate of each of transistors T10 624, T11 626, T13 628 and T15 630 is connected to reference voltage VDD. Transistors T10 624, T11 626, T13 628 and T15 630 effectively provide transistor-type resistance. These transistors T10 624, T11 626, T13 628 and T15 630 may be referred to as transistor-type resistance series.

Transistors T8 632 and T9 634 receive trim signals TRIM-SET2 and TRIM-SET3, respectively and transistors T12 636 and T14 638 receive trim signals TRIM-SET3 and TRIM-SET2, respectively.

The gate of transistor T6 620 receives signal ON0, such that when ON0 is low, portion 604 is off and when ON0 is high, portion 604 is on. Further, the gate of transistor T7 622 receives signal SHAPE0, which as discussed above is a voltage based signal received from write control0 portion 308, as illustrated in FIG. 3.

When portion 604 is turned on, signals TRIM-SET2 and TRIM-SET3 (as received at transistors T8 632, T12 636, T12 636 and T14 638) are used to adjust the effective resistance value provided by the transistor-type resistance series. Specifically, as signals TRIM-SET2 and TRIM-SET3 increase, the effective resistance provided by the transistor-type resistance series decreases, wherein the lowered resistance allows more current to pass to DRIVE 640. Alternatively, as signals TRIM-SET2 and TRIM-SET3 decrease, the effective resistance provided by the transistor-type resistance series increases, wherein the increased resistance allows less current to pass to DRIVE 640. Accordingly, signal TRIM-SET2 and TRIM-SET3 can be used to further adjust the current of the FTOP portion and the ramp down portion of the waveform during the SET operation.

An exemplary chart, TABLE 3, is provided below to illustrate the various phases of the signals and electrical components of portion 604 of block diagram 600 as illustrated in FIG. 6.

TABLE 3

| ON0 | T6 | T7 | T8, T9, T12, T14 | T10, T11, T13, T15 | DRIVE |
|---|---|---|---|---|---|
| 1 | ON | SHAPE0 voltage signal received from write control portion 308 | Controlled by TRIM-SET2 and TRIM-SET3 to adjust current of FTOP and ramp portions | Provide resistance that is increased and decreased based on TRIM-SET2 and TRIM-SET3 | Current of FTOP and ramp portions is controlled by TRIM-SET2 and TRIM-SET3 |
| 0 | OFF | N/A | N/A | N/A | 0 |

Figure 7:
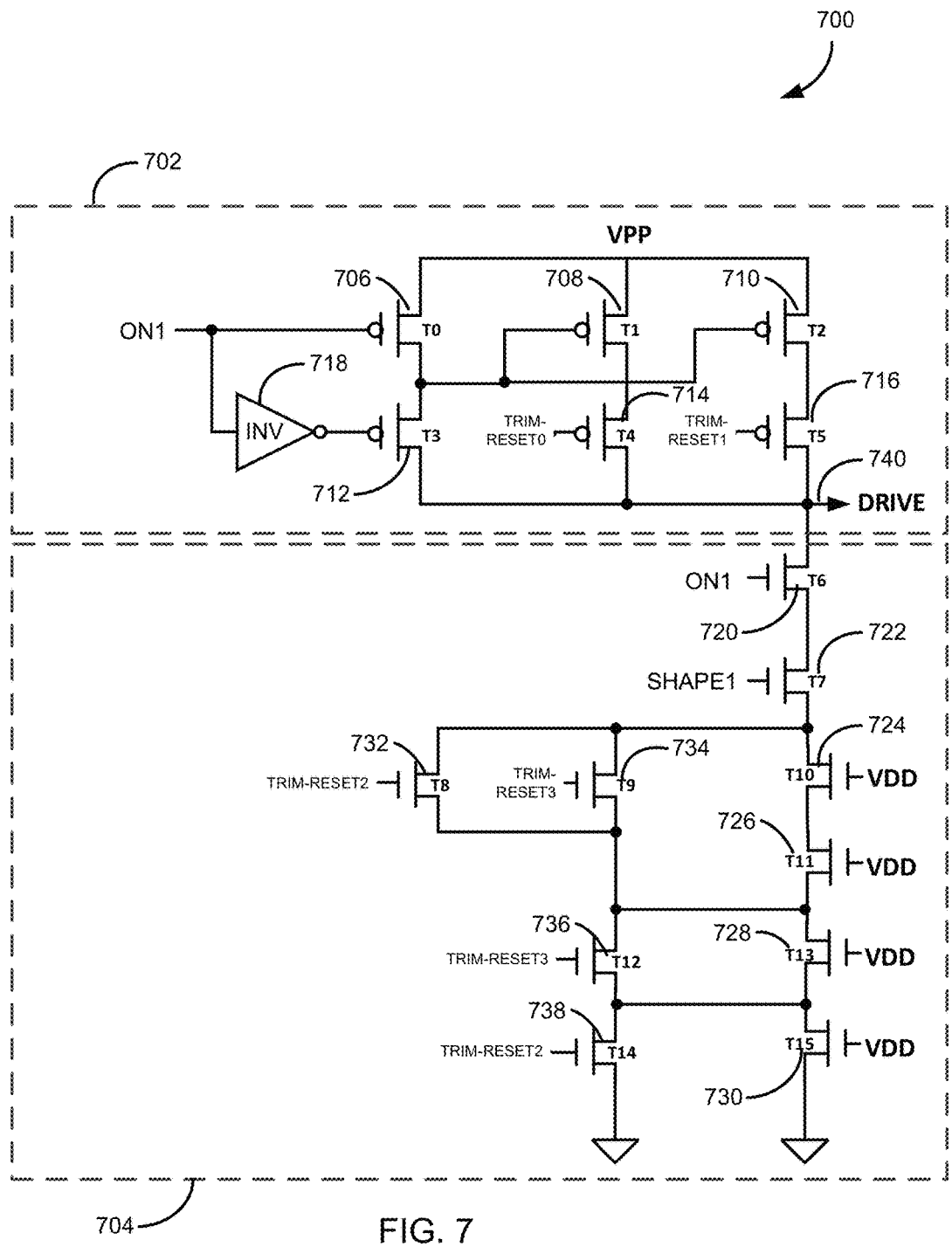
FIG. 7 is a schematic of a current trim1 portion of an adjustable writing circuit, according to an embodiment of the present disclosure.

FIG. 7 is a schematic of a current trim1 portion of an adjustable writing circuit, according to an embodiment of the present disclosure.

Referring to FIG. 7, a block diagram 700 of circuitry is provided. Specifically, the block diagram 700 is the circuitry of the write current trim1 portion 314, as illustrated in FIG. 3. The circuitry of block diagram 700 receives a SHAPE1 signal from write control1 312, as illustrated in FIG. 3.

As described above with reference to FIG. 3, the write current trim1 portion 310 adjusts a current of the RESET portion (e.g., the intermediate segment, as discussed above) of the waveform (using a received voltage based signal SHAPE1) during the RESET operation. This can be achieved, for example, by varying 3 parameters including node capacitance, a current source and a current multiplier at a DRIVE node 740 of the block diagram 700. The circuitry described below is capable of adjusting a current of the RESET portion by 3 orders of magnitude, which results in increased performance and/or reliability of the PCM.

In this embodiment, the block diagram 700 includes portion 702 and portion 704 which are capable of controlling 16 trim steps. Portions 702 and 704 are not limited to 16 trim steps, and can provide $2^n$ trim steps, represented by TRIM-RESET<n-1:0>.

Portion 702 includes transistor T0 706, transistor T1 708, transistor T2 710, transistor T3 712, transistor T4 714, transistor T5 716 and inverter 718. Transistor T0 706 receives signal ON1 at the gate thereof and the inverter 718 also receives signal ON1. Signal ON1 turns the circuitry of block diagram 700 (i.e., write current trim1 portion 314) on and off.

Transistors T4 714 and T5 716 of portion 702 receive trim signals TRIM-RESET0 and TRIM-RESET1, respectively.

For example, when the signal ON1 is low/off, transistor T0 706 is on and transistor T3 712 is off, also causing transistors T1 708 and T2 710 to be off. This causes portion 702 of block diagram 700

Alternatively, when signal ON1 is high/on, transistor T0 706 is off and transistors T3 712, T1 708 and T2 710 are on, which essentially causes portion 702 to be on. That is, when signal ON1 is high/on, portion 702 is on, allowing a trim current ratio to be adjusted by trim signals TRIM-RESET0 and TRIM-RESET1, which are received at the gates of transistors T4 714 and T5 716, respectively. For example, as the TRIM-RESET0 and TRIM-RESET1 signals decrease, transistors T4 714 and T5 716 turn on, causing a current provided at BITLINE of FIG. 3 to become lower. In contrast, as TRIM-RESET0 and TRIM-RESET1 signals increase, transistors T4 714 and T5 716 turn off, causing the current provided at BITLINE of FIG. 3 to become higher.

An exemplary chart, TABLE 4, is provided below to illustrate the various phases of the signals and electrical components of portion 702 of block diagram 700 as illustrated in FIG. 7.

TABLE 4

| ON1 | T0 | T3 | T1 | T2 | DRIVE |
|---|---|---|---|---|---|
| 1 | OFF | ON | ON | ON | Trim current ratio adjusted based on trim signals TRIM-RESET0 and TRIM-RESET1 (as TRIM-RESET0 and TRIM-RESET1 decrease current at DRIVE 640 becomes lower and as TRIM-RESET0 and TRIM-RESET1 increase, current at DRIVE 740 becomes higher) |
| 0 | ON | OFF | OFF | OFF | 0 |

Specifically, when portion 702 is turned on, the trim signals TRIM-RESET0 and TRIM-RESET1 adjust the trim current ratio of the SHAPE1 signal received from the write control1 portion 312 (e.g., the amount of current during the RESET portion is adjusted according to TRIM-RESET0 and TRIM-RESET1). When TRIM-RESET0 and TRIM-RESET1 are lower, T4 714 and T5 716 are on, enabling a current mirror to decrease the current provided at DRIVE 740. As TRIM-RESET0 and TRIM-RESET1 increase, T4 714 and T5 716 turn to off, thus increasing the amount of current at DRIVE 740.

Portion 704 includes transistor T6 720, transistor T7 722, transistor T10 724, transistor T11 726, transistor T13 728, transistor T15 730, transistor T8 732, transistor T9 734, transistor T12 736 and transistor T14 738. The gate of each of transistors T10 724, T11 726, T13 728 and T15 730 is connected to reference voltage VDD. Transistors T10 724, T11 726, T13 728 and T15 730 effectively provide transistor-type resistance. These transistors may be referred to as transistor-type resistance series.

Transistors T8 732 and T9 734 receive trim signals TRIM-RESET2 and TRIM-RESET3, respectively, and transistors T12 736 and T14 738 receive trim signals TRIM-RESET3 and TRIM-RESET2, respectively.

The gate of transistor T6 720 receives signal ON1, such that when ON1 is low, portion 704 is off, and when ON1 is high, portion 704 is on. Further, the gate of transistor T7 722 receives signal SHAPE1, which as discussed above is a voltage based pulse signal received from write control1 portion 312, as illustrated in FIG. 3.

When portion 704 is turned on, signals TRIM-RESET2 and TRIM-RESET3 (as received at transistors T8 732, T9 734, T12 736 and T14 738) are used to adjust the effective resistance value provided by the transistor-type resistance series. Specifically, as signals TRIM-RESET2 and TRIM-RESET3 increase, the effective resistance provided by the transistor-type resistance series decreases, wherein the lowered resistance allows more current to pass to DRIVE 740. Alternatively, as signals TRIM-RESET2 and TRIM-RESET3 decrease, the effective resistance provided by the transistor-type resistance series increases, wherein the increased resistance allows less current to pass to DRIVE 740. Accordingly, signals TRIM-RESET2 and TRIM-RESET3 can be used to further adjust the current of the RESET portion of the waveform during the RESET operation.

An exemplary chart, TABLE 5, is provided below to illustrate the various phases of the signals and electrical components of portion 704 of block diagram 700 as illustrated in FIG. 7.

TABLE 5

| ON1 | T6 | T7 | T8, T9, T12, T14 | T10, T11, T13, T15 | DRIVE |
|---|---|---|---|---|---|
| 1 | ON | SHAPE1 voltage signal received from write control portion 312 | Controlled by TRIM-RESET2 and TRIM-RESET3 to adjust current of RESET portion | Provide resistance that is increased and decreased based on TRIM-RESET2 and TRIM-RESET3 | Current of RESET portion is controlled by TRIM-RESET2 and TRIM-RESET3 |
| 0 | OFF | N/A | N/A | N/A | 0 |

Figure 8A:
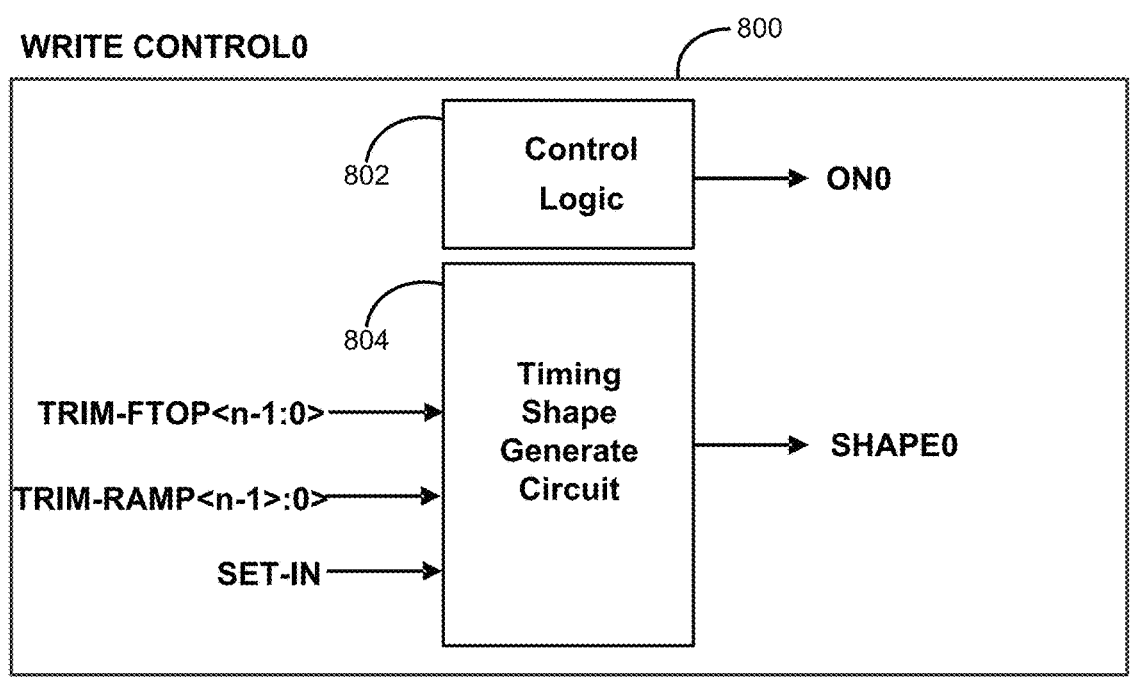
FIG. 8A is a block diagram illustrating features of a write control0 portion of an adjustable writing circuit, according to an embodiment of the present disclosure.

FIG. 8A is a block diagram illustrating features of a write control0 portion of an adjustable writing circuit, according to an embodiment of the present disclosure.

Referring to FIG. 8A, a write control0 portion 800 is illustrated, see also write control0 portion 308 of FIG. 3, where the write control0 portion 800 includes control logic 802 and a timing shape generate circuit 804. The control logic 802 outputs signal ON0, which is used to turn on and off the write current trim0 portion 310 as illustrated in FIG. 3 (see also block diagram 600 of FIG. 6).

The timing shape generate circuit 804 receives signal TRIM-FTOP<n-1:0> and signal TRIM-RAMP<n-1:0> to generate signal SHAPE0, which is received by write current trim0 portion 310, as illustrated in FIG. 3 (see also block diagram 600 of FIG. 6).

The TRIM-FTOP<n-1:0> signal is capable of controlling for example 16 trim steps to adjust a duration of the FTOP portion of the waveform during the SET operation. However, the TRIM-FTOP<n-1:0> signal is not limited to 16 trim steps, and can provide $2^n$ trim steps. The TRIM-RAMP<n-1:0> signal is capable of controlling for example 16 trim steps to adjust a duration of the RAMP portion of the waveform during the SET operation. However, the TRIM-RAMP<n-1:0> signal is not limited to 16 trim steps, and can provide $2^n$ trim steps.

Signal SHAPE0 is a voltage based signal that provides an FTOP voltage and a ramp down signal. SHAPE0 is then further adjusted/trimmed using the circuitry of block diagram 600. Specifically, SHAPE0 generates the FTOP portion (e.g., the intermediate portion of the waveform, as discussed above) and the RAMP portion (e.g., the trailing edge portion of the waveform, as discussed above) having their respective durations trimmed accordingly using a constant current discharging a fixed capacitance of a node which is externally buffered by an OP-AMP (not illustrated) to the write current trim0 portion 310. To speed up a write time, the slope is cut off when the node drops to a specific level.

As mentioned above, signal TRIM-FTOP<n-1:0> sets the FTOP voltage and duration thereof and signal TRIM-RAMP<n-1:0> sets the voltage of the ramp down signal and the duration thereof.

Figure 8B:
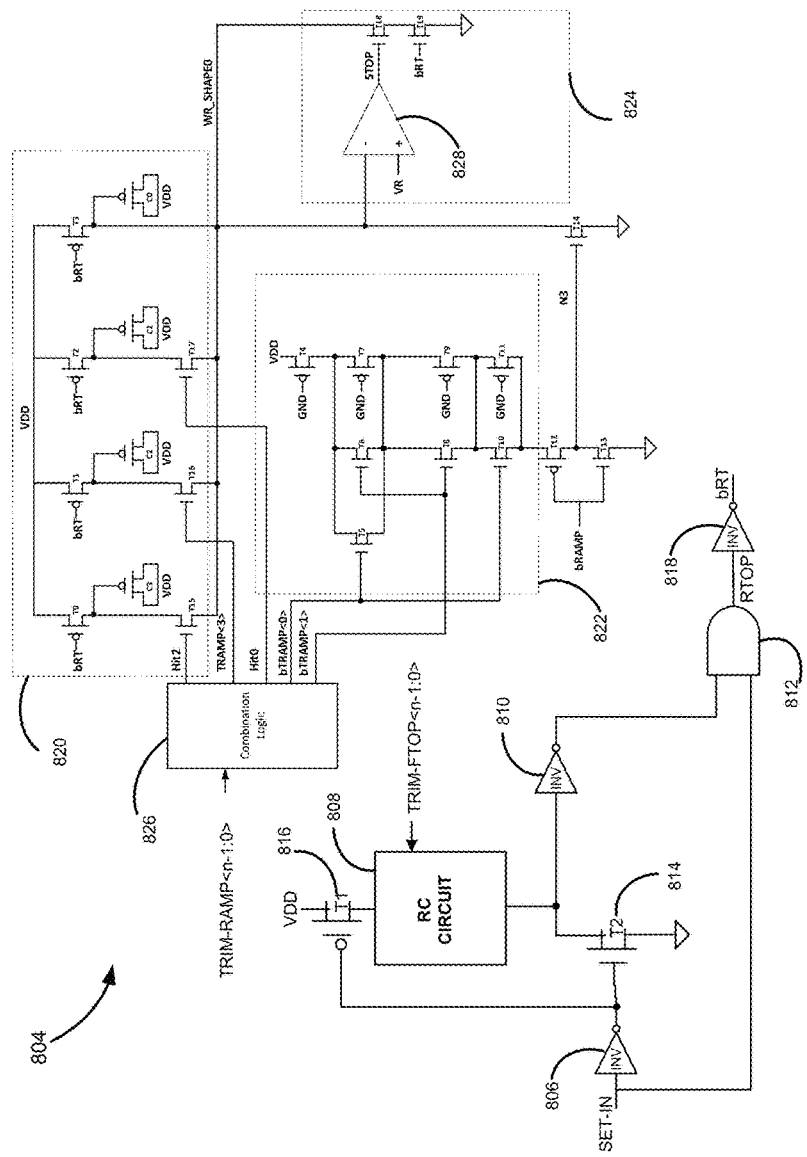
FIG. 8B illustrates an exemplary circuit schematic of the timing shape generate circuit 804 of FIG. 8A.

FIG. 8B illustrates an exemplary circuit schematic of the timing shape generate circuit 804 of FIG. 8A.

Referring to FIG. 8B, this exemplary circuit includes inverters 806, 810 and 818, RC circuit 808, AND gate 812 and transistors T1 816 and T2 814. In an embodiment, this exemplary circuit operates, such that as a SET-IN signal transitions from low to high (i) the gate of transistor T1 816 becomes low (e.g., 0V) causing transistor T1 816 to be on, allowing the RC circuit 808 to be turned on using VDD, (ii) TRIM-FTOP<n-1:0> is received by the RC circuit 808 such that the FTOP voltage and a duration thereof can be set, and (iii) an RTOP signal, as output from the AND gate 812, becomes high. Additionally, inverter 818 inverts the RTOP signal and outputs a bRT signal, such that when the RTOP signal is high, the bRT signal is low.

Further, the circuit of FIG. 8B includes portions 820, 822 and 824, and combination logic 826, which receives the TRIM-RAMP<n−1:0>, as discussed above with reference to FIG. 8A, that is used to control a slope of the ramp down signal and the duration thereof.

Based on TRIM-RAMP<n−1:0>, combination logic 826 outputs signal Hit2, TRAMP<3>, Hit0, bTRAMP<0> and bTRAMP<1>.

Portion 820 acts as an adjustable capacitor and includes transistors T0, T1, T2 and T3, each of which receives, at their respective gates, the bRT signal output from inverter 818. Further, portion 820 includes transistor T15, which receives the Hit2 signal output from the combination logic 826 at the gate thereof, includes transistor T16, which receives the TRAMP<3> signal at a gate thereof, and includes transistor T17, which receives the Hit0 signal at the gate thereof. Portion 820 also includes MOS capacitors C0, C1, C2 and C3, each having their respective sources and drains connected to VDD. Specifically, the drain of each of transistors T0, T1, T2 and T3 is connected to VDD, the gate of each of transistors T0, T1, T2 and T3 is connected to bRT and the source of each of transistors T0, T1, T2 and T3 is connected to the gates of MOS capacitors C3, C2, C1 and C0, respectively.

When the RTOP signal is high, as discussed above, bRT is low, causing each of transistors T0, T1, T2 and T3 to allow MOS capacitors C3, C2, C1 and C0 to charge. When the RTOP signal is low, bRT is high, causing each of transistors T0, T1, T2 and T3 to close, causing MOS capacitors C3, C2, C1 and C0 to discharge accordingly. The Hit2 signal controls the discharge of MOS capacitor C3, such that as Hit2 is high, transistor T15 allows MOS capacitor C3 to discharge to control SHAPE0. The TRAMP<3> signals control the discharge of MOS capacitor C2, such that as TRAMP<3> is high, transistor T16 allows capacitor C2 to discharge to control SHAPE0, and the Hit0 signal controls the discharge of MOS capacitor C1, such that as Hit0 is high, transistor T17 allows MOS capacitor C1 to discharge to control SHAPE0. Further MOS capacitor C0 discharges to control SHAPE0 as signal bRT is high.

Portion 822 provides variable resistance by controlling a current path starting from VDD to node N3. Portion 822 includes transistors T4, T5, T6, T7, T8, T9, T10 and T11. Transistors T4, T7, T9 and T11 are connected in series in a source-to-drain manner with the source of transistor T4 being connected to ground, where the gate of each of transistors T4, T7, T9 and T11 is connected to ground (GND), thus leaving each of transistors T4, T7, T9 and T11 on/open. The gates of transistors T5 and T10 are each connected to signal bTRAMP<0> and the gates of transistors T6 and T8 are each connected to signal bTRAMP<1>. Further, the gates of transistors T12 and T13 are each connected to a bRAMP signal, which is a signal internally generated by the timing shape generate circuit 804. The bRAMP signal is generated using combination logic that causes the bRAMP signal to go low as a result of a falling edge of an RTOP signal and causes the bRAMP signal to go high as a result of a rising edge of a STOP signal. Accordingly, as signals bTRAMP<0> and bTRAMP <1> are low, each of transistors T5, T6, T8, T10 is closed, such that current flows from VDD, through transistors T4, T7, T9 and T11. Furthermore, as bTRAMP<0> becomes high, a new current path opens allowing current to flow through transistors T5 and T10, and as bTRAMP<1> becomes high, a new current path opens allowing current to flow through transistors T6 and T8. As the new current paths open to provide additional current, the resistance provided by portion 822 decreases and, in a similar manner, as the current paths close to reduce current, the resistance provided by portion 822 increases. The output of portion 822 is connected to a source of transistor T12.

Transistors T12 and T13, as described above, are each connected to the signal bRAMP and the respective gates thereof. As signal bRAMP is low, transistor T12 is on and transistor T13 is off, causing node N3 to be controlled by portion 822. In contrast, as signal bRAMP is high, transistor T12 is off and transistor T13 is on, causing node N3 to be grounded by transistor T13. Further, when node N3 is grounded by transistor T13, transistor T14 of the timing generate circuit 804 is closed. In contrast, when node N3 is controlled by portion 822 (e.g., transistor T14 is not grounded by transistor T13), transistor T14 is controlled by the adjustable resistance of portion 822.

Portion 824 includes comparator 828 and transistors T18 and T19. The comparator 828 is connected to reference voltage (VR) at a positive terminal thereof and is connected to the output of portion 820 at a negative terminal thereof. When VR is higher than the input at the negative terminal of the comparator 828, the comparator 828 outputs a low signal (e.g., 0 volts) as a stop signal causing transistor T18 to be off. In contrast, as the input to the negative terminal of the comparator 828 becomes higher than VR, the comparator 828 outputs a high signal as the stop signal, causing transistor T18 to be on. Further, the bRT signal, as output from inverter 818 is high, transistor T19 is on. When transistors T18 and T19 are on, signal SHAPE0 is pulled to ground.

A timing chart illustrating the relationships between the various signals illustrated in FIG. 8B is provided in FIG. 8C, which is discussed in detail below.

FIG. 8C illustrates a timing waveform of signals (e.g., SET-IN, SHAPE0, RTOP, bRAMP, STOP and bRT) in relation to the timing shape generate circuit 804 of FIG. 8A.

Referring to FIG. 8C and as discussed above, the timing shape generate circuit 804 controls the duration/slope of a ramp down during a RAMP portion (e.g., the trailing edge, as discussed above) of the waveform for a SET operation. Specifically, as the SET-IN signal transitions from low to high (and based on the TFTOP<n−1:0> signal) the RTOP signal goes high and the bRT signal goes low. As a result of the bRT signal going high and as a result of the combination logic 826 receiving the TRIM-RAMP<n−1:0> signal, the SHAPE0 becomes high. When the RTOP signal transitions to low as a result of the RC circuit 808, which is adjusted according to the TRIM-FTOP<n−1:0> signal, the bRT signal transitions to high, which triggers the SHAPE0 signal to begin to ramp down at a rate that is controlled by portions 820 and 822 and also as a result of the signal bRAMP transitioning from high to low to control the state of transistor T14.

Further, as illustrated in FIG. 8C with reference to FIG. 8B, signal bRAMP, when transitioning from low to high will quickly pull the SHAPE0 signal down and when the STOP signal becomes high, transistor T18 opens pulling the SHAPE0 signal down. As discussed above, the bRAMP signal is generated by the timing shape generate circuit 804 using combination logic that causes the bRAMP signal to go low as the result of the falling edge of the RTOP signal and causes the bRAMP signal to go high as the result of the rising edge of the STOP signal.

Figure 8D:
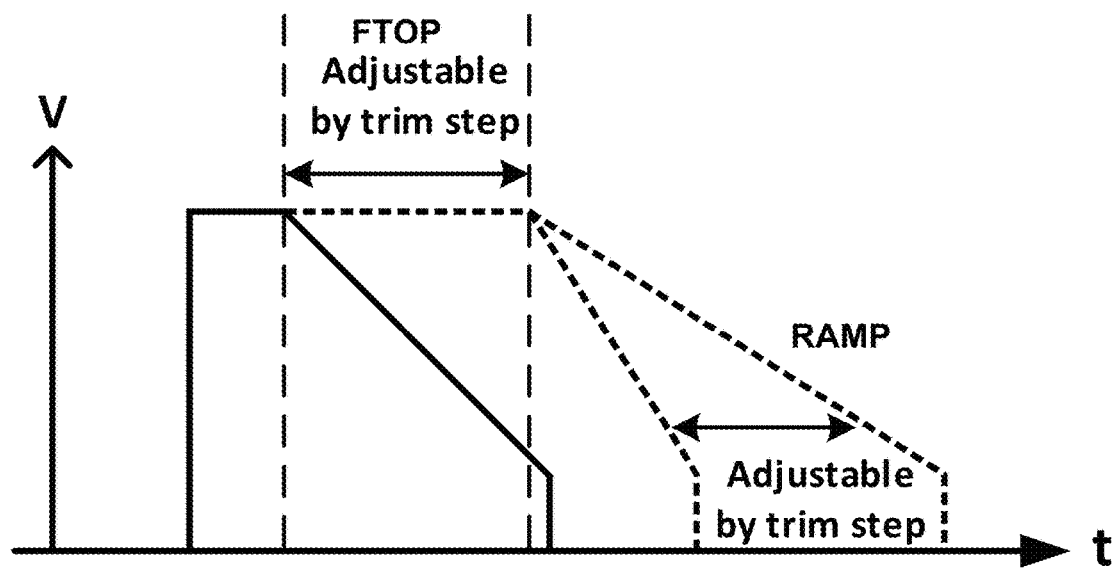
FIG. 8D is a chart illustrating an adjustability of a waveform output as SHAPE0, according to an embodiment of the present disclosure.

FIG. 8D is a chart illustrating an adjustability of a waveform output as SHAPE0, according to an embodiment of the present disclosure.

Referring to FIG. 8D, a waveform of SHAPE0, as output by the timing shape generate circuit 804, is illustrated. Specifically, FIG. 8D illustrates that a FTOP voltage and a ramp down voltage are generated, wherein the duration of the FTOP portion (e.g., the intermediate segment, as discussed above) of the waveform and the ramp down portion (e.g., the trailing edge, as discussed above) of the waveform can be adjustable according to TRIM-FTOP<n−1:0> and TRIM RAMP<n−1:0> signals, as discussed above with reference to FIGS. 8A-8C.

FIG. 9A is a block diagram illustrating features of a write control1 portion of an adjustable writing circuit, according to an embodiment of the present disclosure.

Referring to FIG. 9A, a write control1 portion 900 is illustrated, see also write control1 portion 312 of FIG. 3, where the write control1 portion 900 includes control logic 902 and a timing pulse generate circuit 904. The control logic 902 outputs signal ON1, which is used to turn on and off the write current trim1 portion 314 as illustrated in FIG. 3 (see also block diagram 700 of FIG. 7).

The timing pulse generate circuit 904 receives signal TRIM-PULSE<n−1:0> to generate signal SHAPE1, which is received by write current trim1 portion 314, as illustrated in FIG. 3 (see also block diagram 700 of FIG. 7).

Signal SHAPE1 is a voltage based signal that provides a reset pulse voltage. SHAPE1 is then further adjusted/trimmed using the circuitry of diagram 700. Specifically, SHAPE1 defines a timing of the pulse of the waveform during the RESET portion (e.g., the intermediate portion, as discussed above) of the waveform.

As mentioned above, signal TRIM-PULSE<n−1:0> sets the reset pulse voltage and the duration thereof.

FIG. 9B illustrates an exemplary circuit schematic of the timing pulse generate circuit 904 of FIG. 9A.

Referring to FIG. 9B, this exemplary circuit includes inverters 906 and 910, RC circuit 908, AND gate 912 and transistors T2 914 and T1 916. In an embodiment, this exemplary circuit operates, such that as a SET-IN signal transitions from low to high (i) the gate of transistor T1 916 becomes low (e.g., 0V) causing transistor T1 916 to be on, allowing the RC circuit 908 to be turned on using VDD, (ii) TRIM-PULSE<n−1:0> is received by the RC circuit 908 such that the reset pulse voltage and a duration thereof can be set, and (iii) a SHAPE0 signal, as output from the AND gate 912, becomes high.

FIG. 9C is a chart illustrating an adjustability of a waveform output as WR_SHAPE1, according to an embodiment of the present disclosure.

Referring to FIG. 9C, a waveform of SHAPE1, as output by the timing pulse generate circuit 904, is illustrated. Specifically, FIG. 9C illustrates that a reset pulse is generated, wherein the duration of the reset pulse is adjustable according to the TRIM-PULSE<n−1:0> signal.

FIGS. 10A-10E are charts illustrating various simulation results of a SET operation as adjusted by an adjustable writing circuit, according to various embodiments of the present disclosure.

Referring to FIGS. 10A and 10E, simulation results regarding an adjustable duration of the SPIKE portion of the waveform during the SET operation are illustrated. As described above, the duration of the SPIKE portion is adjusted using TRIM-SPIKE signals, as illustrated in FIG. 5. In this example, TRIM-SPIKE (e.g., TRIM-SPIKE<2:0> is adjusted using 8 trim steps (e.g., TRIM-SPIKE<n−1:0>, where n equals 3). Accordingly, the duration of the SPIKE portion is adjusted using the 8 different trim steps.

Specifically, as illustrated in FIG. 10A, the duration of the SPIKE portion can be adjusted by approximately 11.0 ns by adjusting the trim steps accordingly.

Referring to FIGS. 10B and 10E, simulation results regarding an adjustable duration of the FTOP portion of the waveform during the SET operation are illustrated. As described above, the duration of the FTOP portion is adjusted using TRIM-FTOP signals, as illustrated in FIGS. 8A and 8B. In this example, TRIM-FTOP (e.g., TRIM-FTOP<3:0>) is adjusted using 16 trim steps (e.g., TRIM-FTOP<n−1:0>, where n equals 4). Accordingly, the duration of the FTOP portion is adjusted using the 16 different trim steps.

Specifically, as illustrated in FIG. 10B, the duration of the FTOP portion can be adjusted by approximately 85.0 ns by adjusting the trim steps accordingly.

Referring to FIGS. 10C and 10E, simulation results regarding a current of the FTOP portion of the waveform during the SET operation are illustrated. As described above, the current of the FTOP portion is adjusted using TRIM-SET signals, as illustrated in FIG. 6. In this example, TRIM-SET (e.g., TRIM-SET<3:0>) is adjusted using 16 trim steps (e.g., TRIM-SET<n−1:0>, where n equals 4). Accordingly, the current of the FTOP portion is adjusted using the 16 different trim steps.

Specifically, as illustrated in FIG. 10C, the current of the FTOP portion can be adjusted by approximately 225 microamps by adjusting the trim steps accordingly.

Referring to FIGS. 10D and 10E, simulation results regarding an adjustable duration of the RAMP portion of the waveform during the SET operation are illustrated. As described above, the duration of the RAMP portion is adjusted using TRIM-RAMP signals, as illustrated in FIGS. 8A and 8B. In this example, TRIM-RAMP (e.g., TRIM-RAMP<3:0>) is adjusted using 16 trim steps (e.g., TRIM-RAMP<n−1:0>, where n equals 4). Accordingly, the duration of the RAMP portion is adjusted using the 16 different trim steps.

Specifically, as illustrated in FIG. 10D, the duration of the RAMP portion can be adjusted by approximately 475.0 ns by adjusting the trim steps accordingly.

FIGS. 11A-11D are charts illustrating various simulation results of a RESET operation as adjusted by an adjustable writing circuit, according to an embodiment of the present disclosure.

Figure 11B:
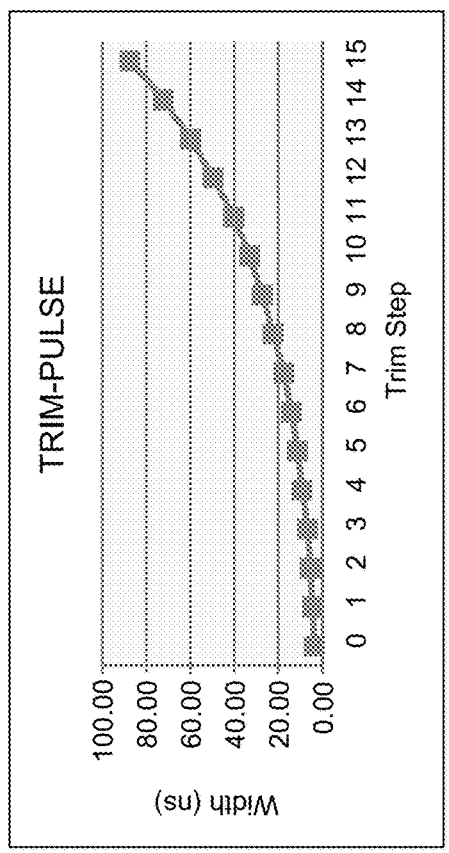
FIG. 11A-11D are charts illustrating various simulation results of a RESET operation as adjusted by an adjustable writing circuit, according to various embodiments of the present disclosure.
Figure 11D:
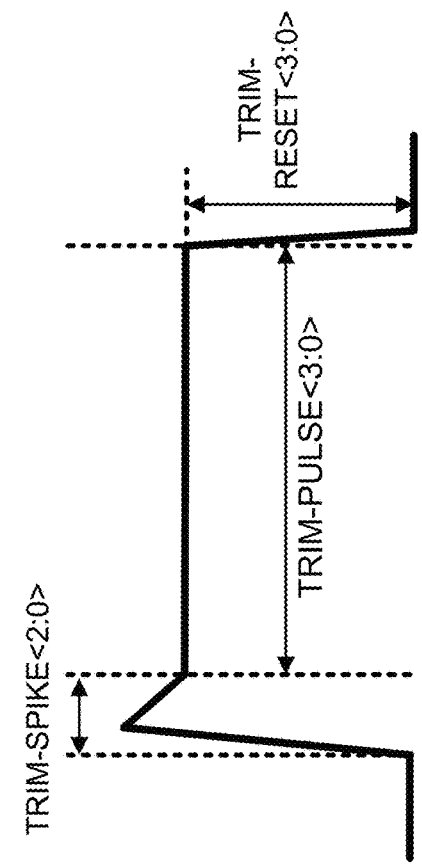
Figure 11A:
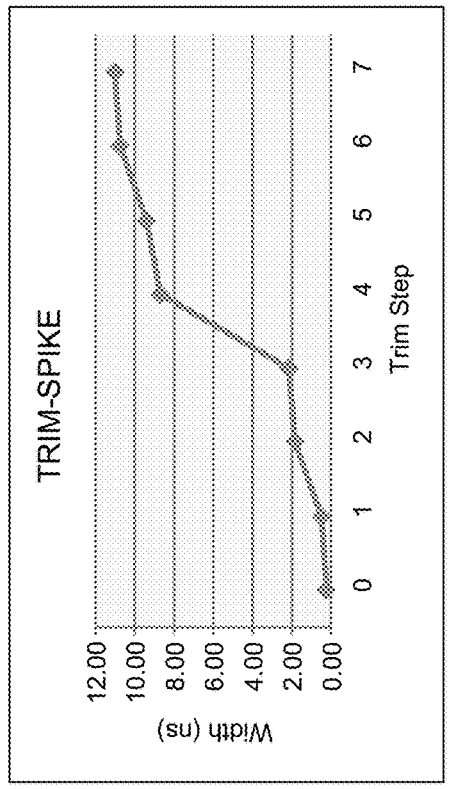

Referring to FIGS. 11A and 11D, simulation results regarding an adjustable duration of the SPIKE portion of the waveform during the RESET operation are illustrated. As described above, the duration of the SPIKE portion is adjusted using TRIM-SPIKE signals, as illustrated in FIG. 5. In this example, TRIM-SPIKE (e.g., TRIM-SPIKE<2:0> is adjusted using 8 trim steps (e.g., TRIM-SPIKE<n−1:0>, where n equals 3). Accordingly, the duration of the SPIKE portion is adjusted using the 8 different trim steps.

Specifically, as illustrated in FIG. 11A, the duration of the SPIKE portion can be adjusted by approximately 11.0 ns by adjusting the trim steps accordingly.

Referring to FIGS. 11B and 11D, simulation results regarding an adjustable duration of the RESET portion of the waveform during the RESET operation are illustrated. As described above, the duration of the RESET portion is adjusted using TRIM-PULSE signals, as illustrated in FIGS. 9A and 9B. In this example, TRIM-PULSE (e.g., TRIM-PULSE<3:0>) is adjusted using 16 trim steps (e.g., TRIM-PULSE<n−1:0>, where n equals 4). Accordingly, the duration of the RESET portion is adjusted using the 16 different trim steps.

Specifically, as illustrated in FIG. 11B, the duration of the RESET portion can be adjusted by approximately 85.0 ns by adjusting the trim steps accordingly.

Figure 11C:
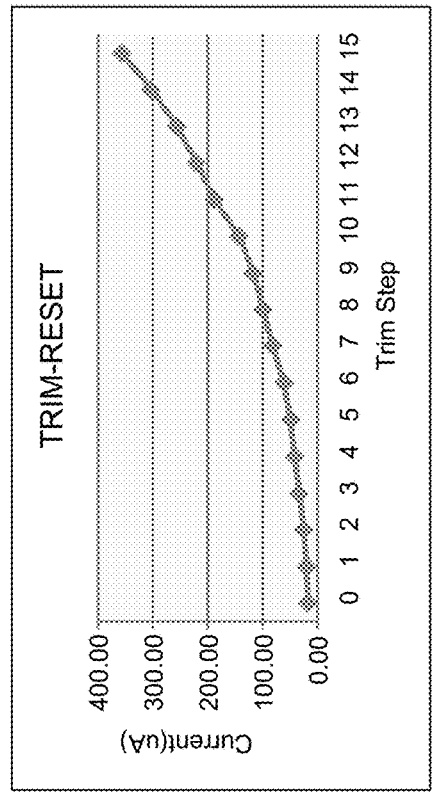

Referring to FIGS. 11C and 11D, simulation results regarding a current of the RESET portion of the waveform during the RESET operation are illustrated. As described above, the current of the RESET portion is adjusted using TRIM-RESET signals, as illustrated in FIG. 7. In this example, TRIM-RESET (e.g., TRIM-RESET<3:0>) is adjusted using 16 trim steps (e.g., TRIM-RESET<n−1:0>, where n equals 4). Accordingly, the current of the RESET portion is adjusted using the 16 different trim steps.

Specifically, as illustrated in FIG. 11C, the current of the WRH portion can be adjusted by approximately 375 microamps by adjusting the trim steps accordingly.

Figure 12:
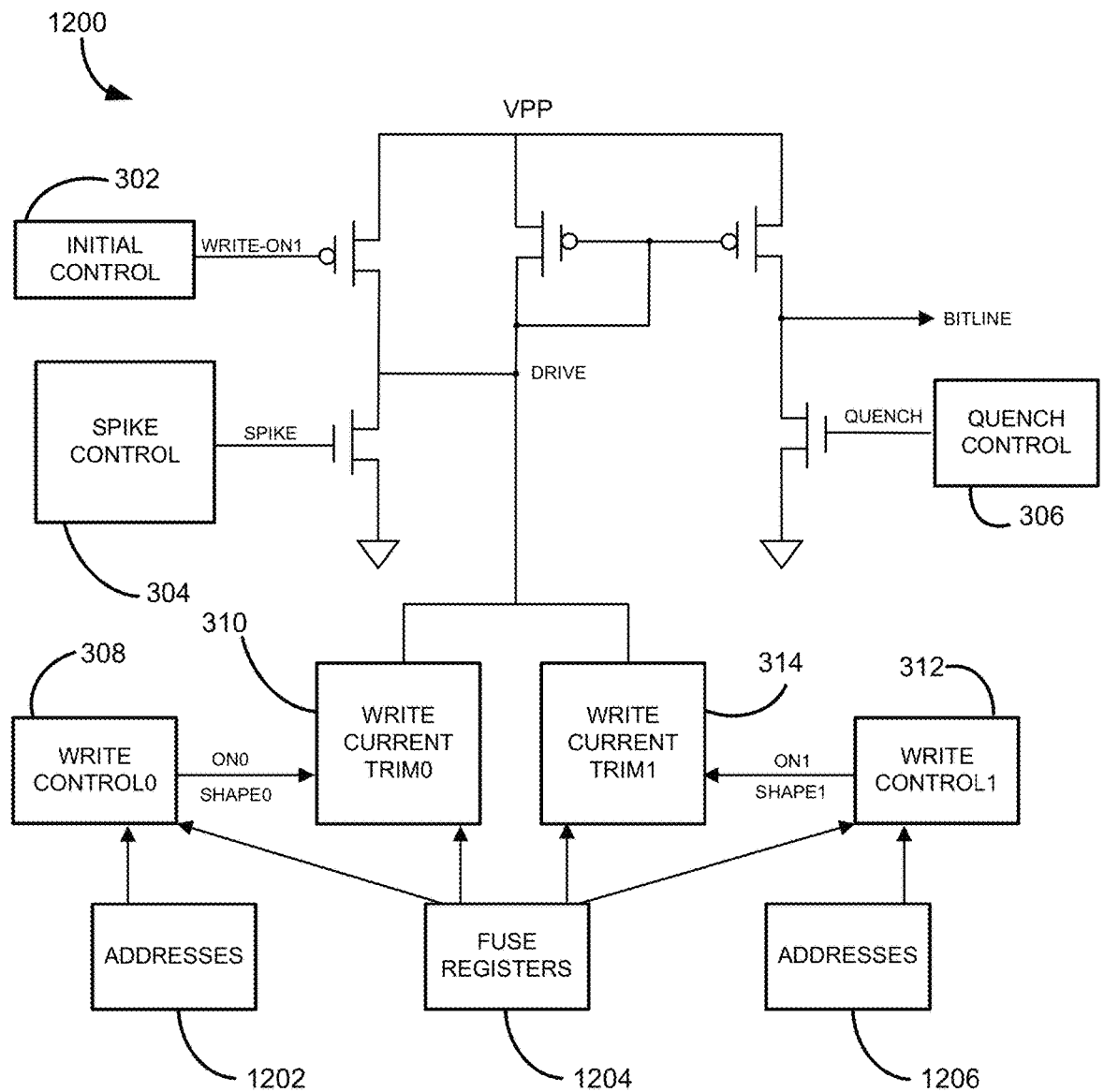
FIG. 12 is a block diagram illustrating various aspects according to which a writing circuit is adjustable, according to an embodiment of the present disclosure.

FIG. 12 is a block diagram illustrating various aspects according to which a writing circuit is adjustable, according to an embodiment of the present disclosure.

FIG. 12 is similar to above-described FIG. 3, except that additional portions have been added to the adjustable writing circuit. Descriptions of portions of FIG. 12 that are identical to FIG. 3 are omitted.

Referring to FIG. 12, a block diagram 1200 representing the adjustable writing circuit is illustrated. As illustrated, the adjustable writing circuit includes an initial control portion 302, a spike control portion 304, a quench control portion 306, a write control0 portion 308, a write current trim0 portion 310, a write control1 portion 312, a write current trim1 portion 314 and a DRIVE node.

Each of the various portions 302, 304, 306, 308, 310, 312 and 314 is capable of controlling a waveform output from the adjustable writing circuit to a bitline of a PCM. As illustrated, programming voltage (VPP) is supplied to the adjustable writing circuit, as described above with respect to FIG. 3.

Further, block diagram 1200 includes address (ADDRs) portion 1202, fuse registers 1204 and address (ADDRs) portion 1206. The fuse registers 1204 include information regarding various trim steps that can be downloaded by write control0 308, write current trim0 310, write control1 312 and write current trim1 314. These trim steps can be arranged, for example, in an array.

Further ADDRs portions 1202 and 1206 contain address information which allow for the selection of various trim steps. These additional portions illustrated in FIG. 12 can overcome potential loading issues.

Figure 13A:
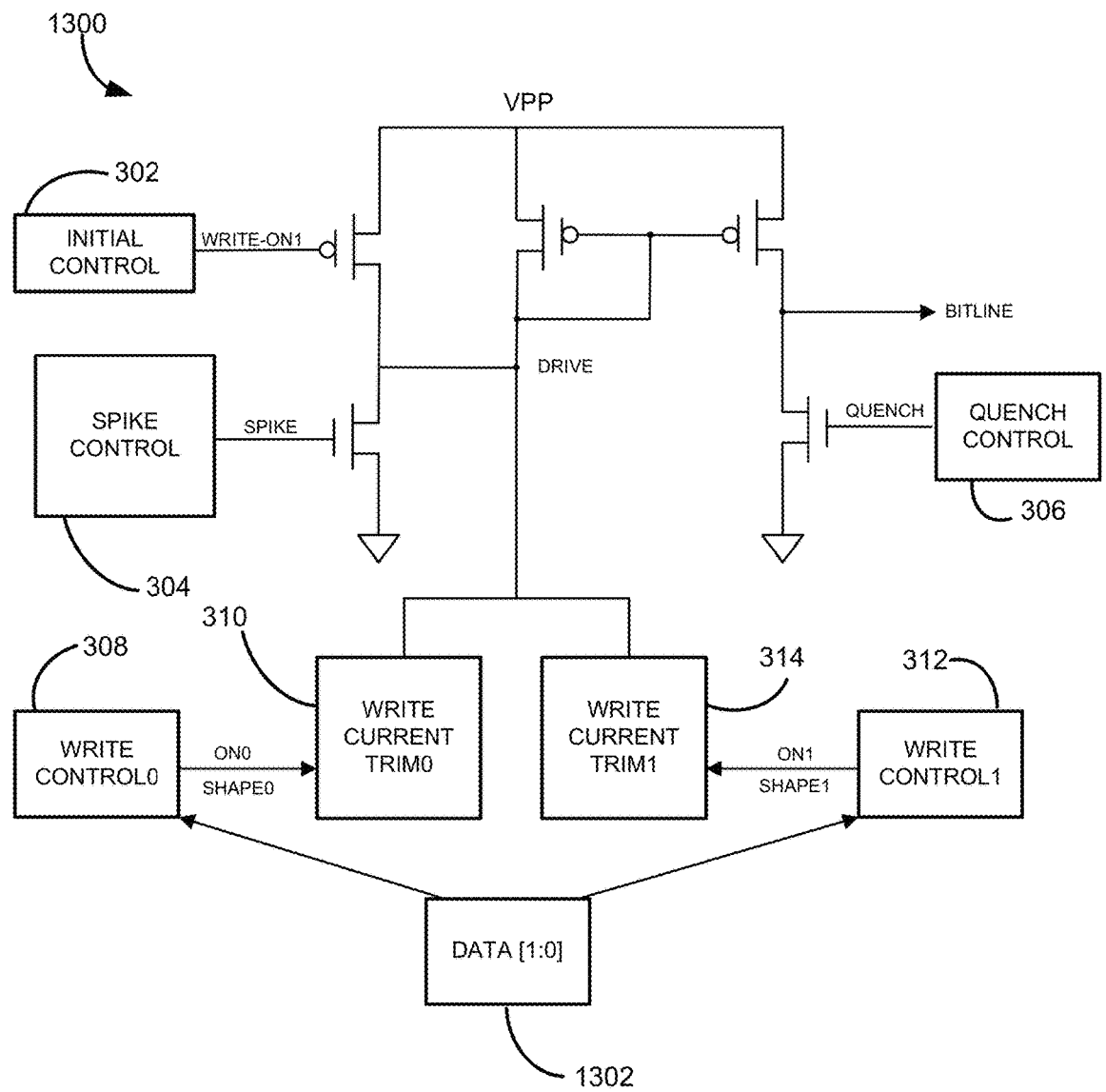
FIG. 13A is a block diagram illustrating various aspects according to which a writing circuit is adjustable and can be applied to different types of memory, according to an embodiment of the present disclosure.

FIG. 13A is a block diagram illustrating various aspects according to which a writing circuit is adjustable and can be applied to different types of memory, according to an embodiment of the present disclosure.

FIG. 13A is similar to above-described FIG. 3, except that additional portions have been added to the adjustable writing circuit. Descriptions of portions of FIG. 12 that are identical to FIG. 3 are omitted.

Referring to FIG. 13A, a block diagram 1300 representing the adjustable writing circuit is illustrated. As illustrated, the adjustable writing circuit includes an initial control portion 302, a spike control portion 304, a quench control portion 306, a write control0 portion 308, a write current trim0 portion 310, a write control1 portion 312, a write current trim1 portion 314 and a DRIVE node.

Each of the various portions 302, 304, 306, 308, 310, 312 and 314 is capable of controlling a waveform output from the adjustable writing circuit to a bitline of a PCM. As illustrated, programming voltage (VPP) is supplied to the adjustable writing circuit, as described above with respect to FIG. 3.

As mentioned above, the adjustable writing circuit is not only applicable to PCM, but can be applied to MLC memory. In an implementation of the adjustable writing circuit to write to MLC memory, block diagram 1300 includes data [1:0] portion 1302.

Figure 13B:
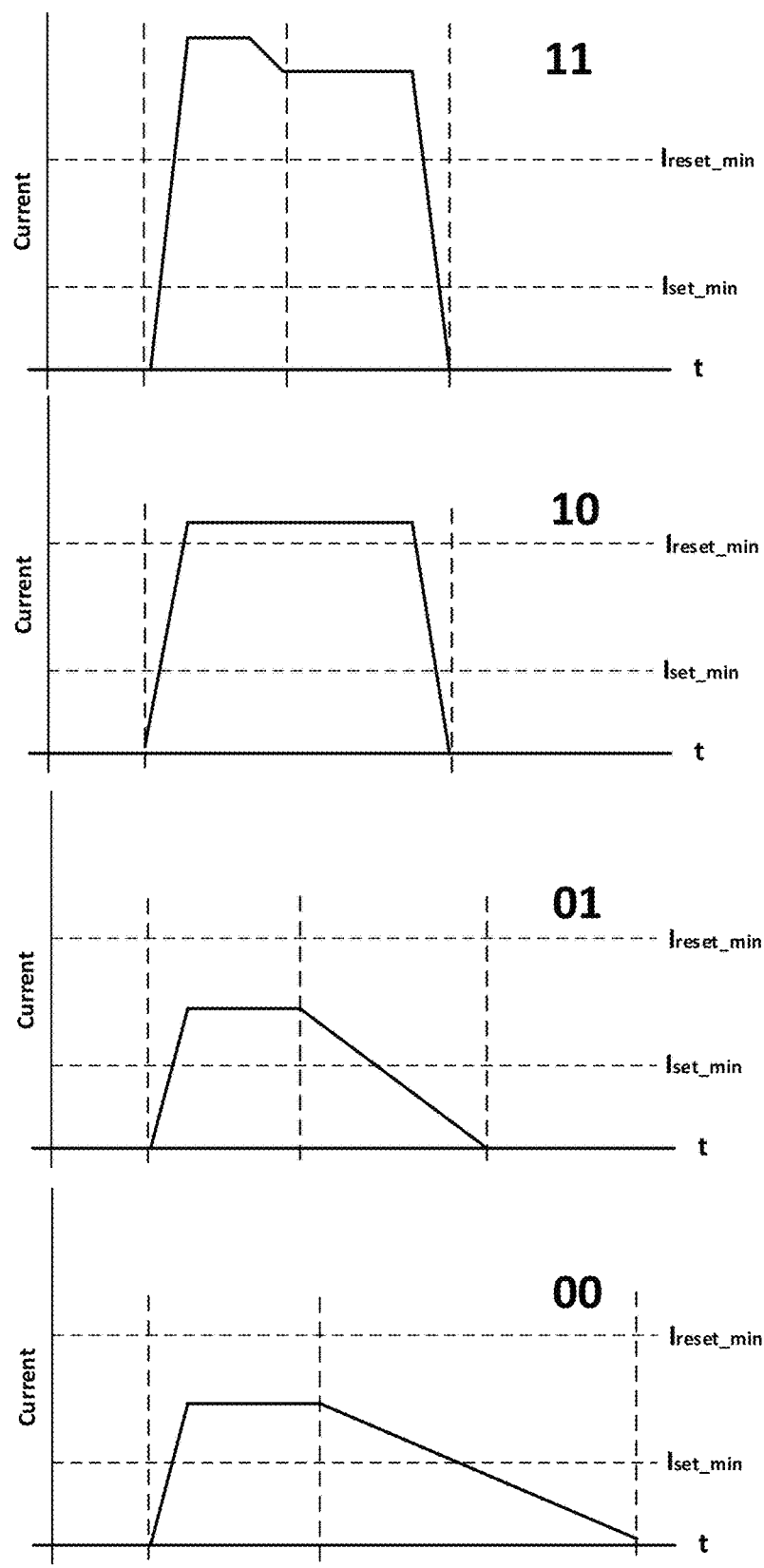
FIG. 13B illustrates 4 waveforms generated according to the embodiment illustrated in FIG. 13A.

In this implementation, the adjustable writing circuit is applied to an MLC memory, where data from the DATA [1:0] portion is used to control, for example, a shape of 4 waveforms, as illustrated FIG. 13B. The adjustable writing circuit is not limited to these examples, and can adjust and control other shaped waveforms based on device characterization. Referring to FIGS. 13A and 13B, write control1 portion 312 controls the waveform during the RESET operation using DATA [1:0]=11/10, and write control0 portion 308 controls the waveform during the SET operation using DATA [1:0]=01/00. This data for adjusting and controlling the trim, as performed by the write control0 portion 308 and the write control1 portion 312 can be stored in DATA [1:0] in the form of, for example, an array.

Examples of above-mentioned waveforms based on DATA [1:0]=11/10 and DATA [1:0] 01/00 are illustrated in FIG. 13B, where waveforms 11 and 10 illustrate the different waveforms generated during the RESET operation and waveforms 01 and 00 illustrate the different waveforms generated during the SET operation. These different waveforms can to implemented, for example, during the SET and RESET operations of MLC memory.

Figure 14A:
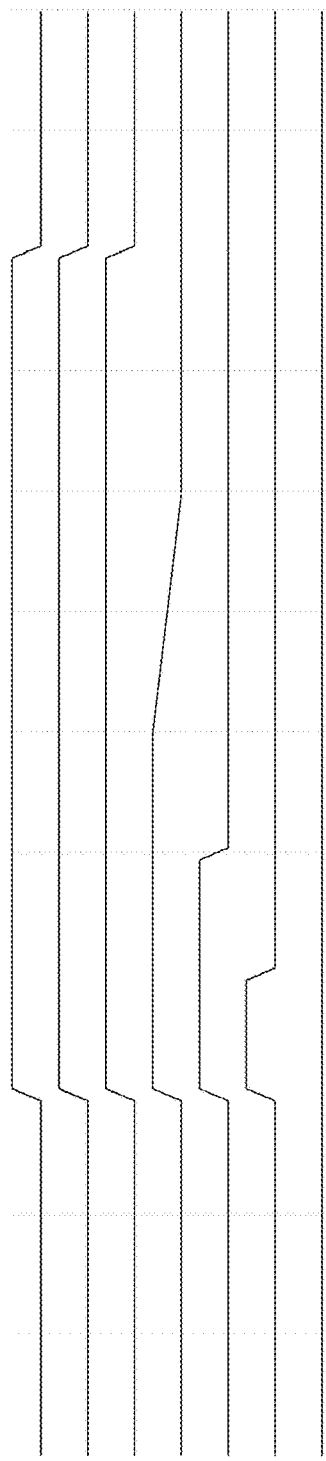
FIG. 14A illustrates a timing waveform of signals (e.g., WRITE-ON, ON0, SET-IN, SHAPE0, SPIKE-ON, SPIKE, QUENCH) during a SET operation, according to an embodiment of the present disclosure.

FIG. 14A illustrates an example of timing waveform signals (e.g., WRITE-ON, ON0, SET-IN, SHAPE0, SPIKE-ON, SPIKE, QUENCH) during a SET operation according to an embodiment of the present disclosure.

Referring to FIG. 14A, the WRITE-ON, ON0, SET-IN, SHAPE0, SPIKE-ON, and SPIKE signal change from low to high at a specific time. In an embodiment, this specific time is near the leading edge of the waveform during the SET operation. The SPIKE and SPIKE-ON signals transition back to low when the waveform transitions from the leading edge to the intermediate segment. The SHAPE0 signal transitions from high to low when the waveform transitions from the intermediate segment to the trailing edge of the waveform during the SET operation. Further, the QUENCH signal is not used during the SET operation.

Figure 14B:
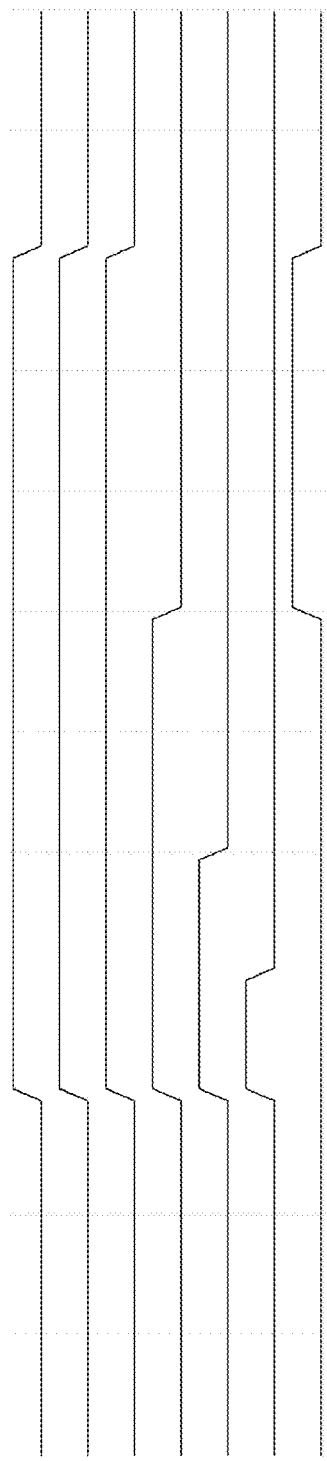
FIG. 14B illustrates a timing waveform of signals (e.g., WRITE-ON, ON1, SET-IN, SHAPE1, SPIKE-ON, SPIKE, QUENCH) during a RESET operation, according to an embodiment of the present disclosure.

FIG. 14B illustrates an example of timing waveform signals (e.g., WRITE-ON, ON1, SET-IN, SHAPE1, SPIKE-ON, SPIKE, QUENCH) during a RESET operation according to an embodiment of the present disclosure.

Referring to FIG. 14B, the WRITE-ON, ON1, SET-IN, SHAPE1, SPIKE-ON, and SPIKE signal change from low to high at a specific time. In an embodiment, this specific time is near the leading edge of the waveform during the RESET operation. The SPIKE and SPIKE-ON signals transition back to low when the waveform transitions from the leading edge to the intermediate segment. The SHAPE1 signal transitions from high to low when the waveform transitions from the intermediate segment to the trailing edge of the waveform during the RESET operation. Further, the QUENCH signal transitions from low to high around the time that the SHAPE1 signal transitions from high to low.

Figure 15:
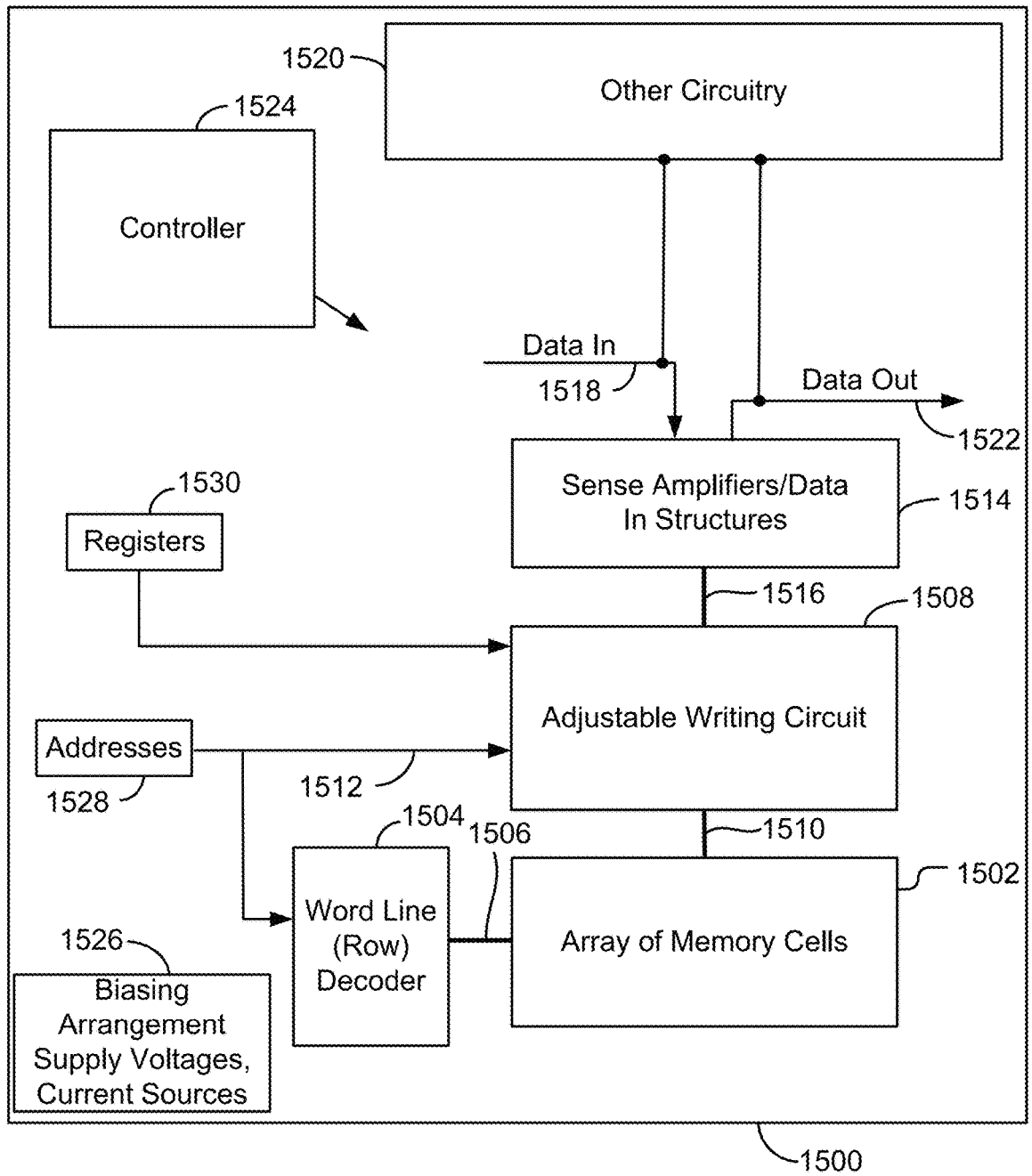
FIG. 15 is a simplified block diagram of an integrated circuit in accordance with an embodiment of the present disclosure.

FIG. 15 is a simplified block diagram of an integrated circuit array in accordance with an embodiment.

Referring to FIG. 15, a simplified block diagram of an integrated circuit 1500 is illustrated. The integrated circuit 1500 includes a memory array of memory cells 1502. In an implementation, a word line decoder 1504 is coupled to and in electrical communication with a plurality of word lines 1506. An adjustable writing circuit 1508, such as for example the adjustable writing circuit 300 of FIG. 3, is in electrical communication with a plurality of bit lines 1510 to read data from, and write data to, the memory array 1502 including memory cells (not shown). A bit line (column)

decoder (not shown) may be implemented to read and write data to and from the memory array 1502.

Addresses 1528 are supplied on bus 1512 to the word line decoder 1504 and the adjustable writing circuit 1508. The adjustable writing circuit 1508 may obtain addresses 1528 at which parameters for adjusting the adjustable writing circuit 1508 are stored. The parameters are accessed from a parameter storage, such as specific addresses (not shown) external to the integrated circuit 1500 and/or such as registers 1530 on the integrated circuit 1500 based on the obtained addresses 1528. These parameters that are accessed by the adjustable writing circuit 1508 are used to adjust various characteristics (e.g., shape characteristics) of the adjustable writing circuit 1508 to set, for example, shape characteristics of at least one of an amplitude, a duration and a slope. For example, the parameters can be used to set or adjust various trim steps, such as the above-described TRIM-SPIKE, TRIM-FTOP, TRIM-SET, TRIM-RAMP, TRIM-PULSE AND TRIM-RESET signals.

Further, for example, the addresses 1528 may identify, which memory block of the array 1502 a cell (or page) being written to is in, wherein the parameters can be different from each memory block.

Sense amplifiers and data-in structures in block 1514 are coupled to the adjustable writing circuit 1508 via data bus 1516. Data is supplied via a data-in line 1518 from input/output ports on the integrated circuit 1500, or from other data sources internal or external to the integrated circuit 1500, to data-in structures in block 1514. Other circuitry 1520 may be included on the integrated circuit 1500, such as a general purpose processor or special purpose application circuitry, or a combination of modules providing system-on-a-chip functionality supported by the array of memory cells 1502. Data is supplied via a data-out line 1522 from the sense amplifiers in block 1514 to input/output ports on the integrated circuit 1500, or to other data destinations internal or external to the integrated circuit 1500.

A controller 1524 implemented in this example, using a bias arrangement state machine, controls the application of bias arrangement supply voltages 1526, such as read, program, and program verify voltages. The controller 1524 may be implemented using special-purpose logic circuitry as known in the art. In alternative embodiments, the controller 1524 comprises a general-purpose processor, which may be implemented on the same integrated circuit 1500 to execute a computer program to control the operations of the device. In yet other embodiments, a combination of special-purpose logic circuitry and a general-purpose processor may be utilized for implementation of the controller 1524.

It will be understood that the memory array is not limited to the array configuration illustrated in FIG. 1B and additional array configurations can also be used with memory cells including the memory element disclosed above.

Figure 16:
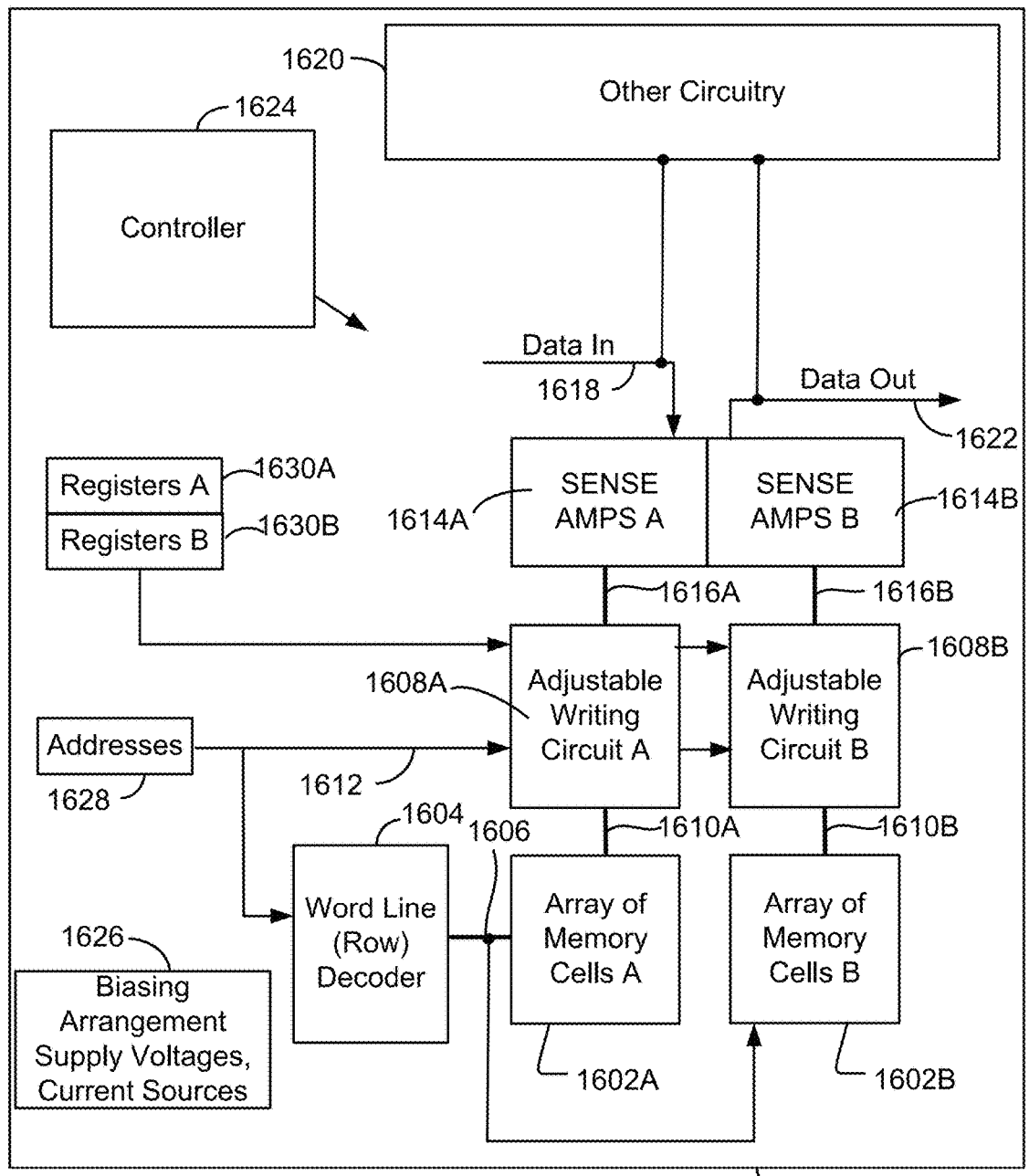
FIG. 16 is a simplified block diagram of an integrated circuit in accordance with an embodiment of the present disclosure.

FIG. 16 is a simplified block diagram of an integrated circuit array in accordance with an embodiment of the present disclosure.

Referring to FIG. 16, a simplified block diagram of an integrated circuit 1600 is illustrated in which different parameter stores (e.g., storages) are provided, and dedicated to the adjustable writing circuits for respective blocks in a plurality of memory blocks in the array. The integrated circuit 1600 includes a plurality (two in the illustrated example) of memory blocks, including block (e.g., an array of memory cells A) 1602A and block (e.g., an array of memory cells B) 1602B of memory cells. The memory cells can be phase change memory cells. The memory cells in the plurality of blocks can have the same structure in all of the blocks, or can have different structures in different blocks.

In an implementation, a word line decoder 1604 is coupled to and in electrical communication with a plurality of word lines 1606 that are coupled to both blocks 1602A and 1602B in this example. In other examples, separate word line decoders and drivers are used for the separate blocks. Adjustable writing circuit 1608A, such as for example the adjustable writing circuit 300 of FIG. 3, is in electrical communication with a plurality of bit lines 1610 to read data from, and write data to, the memory block 1602A including memory cells (not shown). A bit line (column) decoder (not shown) may be implemented to read and write data to and from the memory block 1602A. Adjustable writing circuit 1608B, such as for example the adjustable writing circuit 300 of FIG. 3, is in electrical communication with a plurality of bit lines 1610B to read data from, and write data to, the memory block 1602B including memory cells (not shown). A bit line (column) decoder (not shown) may be implemented to read and write data to and from the memory block 1602B.

Addresses 1628 are supplied on bus 1612 to the word line decoder 1604 and the adjustable writing circuits 1608A and 1608B. The adjustable writing circuits 1608A and 1608B may obtain addresses 1628 and respond to the addresses within their respective blocks to select which parameters to use for adjusting the adjustable writing circuit 1608A. The parameters used by adjustable writing circuit 1608A are accessed in this example from a parameter storage such as registers 1630A on the integrated circuit 1600. The parameters used by adjustable writing circuit 1608B are accessed in this example from a parameter storage such as registers 1630B on the integrated circuit 1600. These parameters that are accessed by the adjustable writing circuit 1608A and 1608B are used to adjust various characteristics (e.g., shape characteristics) of the adjustable writing circuit 1608A and 1608B to set, for example, shape characteristics of at least one of an amplitude, a duration and a slope. For example, the parameters can be used to set or adjust various trim steps, such as the above-described TRIM-SPIKE, TRIM-FTOP, TRIM-SET, TRIM-RAMP, TRIM-PULSE AND TRIM-RESET signals.

Further, for example, the addresses 1628 may identify, which memory block 1602A or 1602B or which sub-block a cell (or page) being written to is in, wherein the parameters can be different from each memory block or each sub-block.

Sense amplifiers and data-in structures in blocks 1614A and 1614B are coupled to the adjustable writing circuits 1608A and 1608B via data buss 1616A and 1616B, respectively. Data is supplied via a data-in line 1618 from input/output ports on the integrated circuit 1600, or from other data sources internal or external to the integrated circuit 1600, to data-in structures in blocks 1614A and/or 1614B. Other circuitry 1620 may be included on the integrated circuit 1600, such as a general purpose processor or special purpose application circuitry, or a combination of modules providing system-on-a-chip functionality supported by the array of memory cells 1602A and/or 1602B. Data is supplied via a data-out line 1622 from the sense amplifiers in blocks 1614A and/or 1614B to input/output ports on the integrated circuit 1600, or to other data destinations internal or external to the integrated circuit 1600.

A controller 1624 implemented in this example, using a bias arrangement state machine, controls the application of bias arrangement supply voltages 1626, such as read, program, and program verify voltages and other voltages used by the adjustable writing circuits. The controller 1624 may be implemented using special-purpose logic circuitry as known in the art. In alternative embodiments, the controller 1624 comprises a general-purpose processor, which may be implemented on the same integrated circuit 1600 to execute a computer program to control the operations of the device. In yet other embodiments, a combination of special-purpose logic circuitry and a general-purpose processor may be utilized for implementation of the controller 1624.

In the illustrated examples, the adjustable writing circuit comprises a pulse shaping circuit coupled to the bit lines in memory array. In other embodiments, an adjustable writing circuit is coupled to the word lines, or source lines in array architectures using source lines, and configured as described herein. Also, adjustable writing circuits can be used on more than one of the bit lines, word lines and source lines as suits a particular memory implementation.

It will be understood that the memory array is not limited to the array configuration illustrated in FIG. 1B and additional array configurations can also be used with memory cells including the memory element disclosed above.

Example Implementations of the Present Disclosure

Various technologies implemented as described with reference to some or all of FIGS. 1A-16 are provided below.

In an implementation, a write pulse driver is provided. The write pulse driver can be, at least partially, implemented as an adjustable writing circuit 1508 as illustrated in FIG. 15 or writing circuits 1608A and 1608B as illustrated in FIG. 16. The write pulse driver (e.g., the adjustable writing circuit) includes a parameter storage, such as a register, addresses, a data bank (FIGS. 12, 13A and 15), storing a set of parameters specifying characteristics of a write pulse. Further, the write pulse driver includes driver circuitry, such as the adjustable writing circuit (e.g., block diagram 300 illustrated in FIG. 3) configured to generate the write pulse on an output node, such as the bit line illustrated in FIG. 3. The write pulse includes a leading edge, a trailing edge and an intermediate segment between the leading edge and the trailing edge, such as the waveforms illustrated for example in FIGS. 4A and 4B. Further, the driver circuitry includes pulse shaping circuits that set shape characteristics of at least one of an amplitude, a duration and a slope of more than one of the leading edge, the trailing edge and the intermediate segment of the write pulse using the set of parameters. For example, as illustrated in FIGS. 4A and 4B, the write pulse for a set operation includes an adjustable spike in the leading edge, an adjustable flat top portion in the intermediate segment and a downward ramp portion in the trailing edge.

The write pulse may be a set pulse for a set operation, as illustrated in FIG. 4A, of a phase change memory device including phase change cells as illustrated in FIGS. 1A and 1B, and may be a reset pulse for a reset operation, as illustrated in FIG. 4B of the phase change memory device.

The pulse shaping circuits of the driver circuitry (e.g., an initial control 302, a spike control 304, a write control0 308, a write current trim0 310, a write control 1 312, a write current trim1 314 and a quench control 306) set the shape characteristics of at least one of the amplitude, the duration and the slope of each of the leading edge, the trailing edge and the intermediate segment of the write pulse using the parameters.

Additionally, the pulse shaping circuits may include a current mirror having a control leg and an output leg connected to the output node (e.g., a bit line) as illustrated in FIG. 3, a first current source, such as the spike control portion 304 illustrated in FIG. 3 and further illustrated as element 500 in FIG. 5 for controlling a duration of the leading edge (e.g. the adjustable spike portion of the waveform illustrated in FIGS. 4A and 4B).

Further, the pulse shaping circuits can include a second current source, such as the write control0 and the write control1 portions 308 and 312 and the current trim0 and current trim1 portions 310 and 314 illustrated in FIG. 3 (also illustrated as block diagrams and/or circuitry 600, 700, 800, 804, 900 and 904 in FIGS. 6, 7, 8A, 8B, 9A and 9B) for controlling a second interval (e.g., a duration and magnitude) during the intermediate segment (FTOP portion and RESET portion of the waveforms of FIGS. 4A and 4B) and a portion of a third interval (e.g., a duration and magnitude) of the trailing edge (RAMP portion of the waveform of FIG. 4A). Accordingly, as implemented, the second current source can control, for example, the duration and current magnitude of the FTOP and RAMP portions of the waveform during the SET operation as illustrated in FIG. 4A and the duration and magnitude of the RESET portion of the waveform during the RESET operation as illustrated in FIG. 4A.

The pulse shaping circuits may also include a third current source, such as the quench control 306 of FIG. 3, coupled to the output leg and configured to, responsive to a parameter or another signal, sink (e.g., pull down) a current output from the output leg of the current mirror during the trailing edge of the write pulse.

Furthermore, the above-described first current source, which can be implemented as a spike control 304 as illustrated in FIG. 3, can set a current spike duration during the leading edge of the write pulse (e.g., the adjustable SPIKE portion of the wave form illustrated in FIGS. 4A and 4B for the SET and RESET operations). This leading edge of the write pulse is adjusted based on a parameter of the above-described set of parameters.

The above-described second current source can be implemented, with reference to FIG. 3, as a write control0 308 and a current trim0 310 during the SET operation and can be implemented as a write control1 312 and a current trim1 314 during the RESET operation (also illustrated as a block diagram 600 of the current trim0 portion, write control0 800, and circuit 804 in FIGS. 6, 8A and 8B and illustrated as current trim1 700, write control1 900 and circuit 904 in FIGS. 7, 9A and 9B). The second current source can set a current magnitude and duration during the intermediate segment of the write pulse (e.g., the current and duration adjustable FTOP portion of the waveform during the SET operation, as illustrated in FIG. 4A, and the current and duration adjustable RESET portion of the waveform during the RESET operation, as illustrated in FIG. 4B). The second current source sets the current magnitude and duration during the intermediate segment based on a parameter of the set of parameters.

The above-described third current source can be implemented as a quench control 306 as illustrated in FIG. 3. The third current source can quench a current magnitude during the trailing edge of the write pulse (e.g., the rapid current pull-down of the waveform during the RESET operation, as illustrated in FIG. 4B). This quench can be performed based on a parameter of the set of parameters or a signal.

The write pulse driver can be implemented to write to an array of programmable resistance memory cells, such as the array of memory cells 1502 as illustrated in FIG. 15 and also as illustrated and described with reference to FIGS. 1A and 1B. Specifically, the driver circuitry can apply the write pulse (e.g., the waveforms illustrated in FIGS. 4A and 4B), as a first write pulse and a second write pulse to the array of programmable resistance memory cells. The first write pulse can be a set pulse, such as the waveform illustrated in FIG. 4A, for the array of programmable resistance memory cells. Moreover, the second write pulse is configured as a reset pulse, such as the waveform illustrated in FIG. 4B, for the array of programmable resistance memory cells.

The circuits of the driver circuitry can include a fourth current source coupled to the control leg and configured to, responsive to a parameter of the set of parameters, apply a fourth current to the control leg to control the second interval during an intermediate segment of the second write pulse and at least a portion of a trailing edge of the second write pulse. Accordingly, this fourth current source can be implemented as the current trim1 314 and the write control 1 312 of FIG. 3 to control the second interval during the RESET portion and the end portion of the waveform of the RESET operation of FIG. 4B.

The first current source can be turned on during an ON state of a control signal, such as the SPIKE-ON signal illustrated in FIG. 5 and as further described in the timing charts of FIGS. 14A and 14B. A duration of the ON state of the control signal (e.g., SPIKE-ON signal) can be set using a parameter of the set of parameters.

The second current source can be turned on during the intermediate segment (e.g., the FTOP and/or RESET portions of the waveforms), and includes a plurality of current sources (e.g., portions 602 and 702 of FIGS. 6 and 7) and a dynamic resistance circuit (e.g., portions 604 and 704 of FIGS. 6 and 7) configured to set a current magnitude and duration during the intermediate segment. A number of current sources of the plurality of current sources to be enabled during the intermediate segment and a resistance of the dynamic resistance circuit are set using parameters of the set of parameters.

The second current source can include one or more control transistors coupled, such as transistors 620, 622, 720 and 722 of FIGS. 6 and 7, between the plurality of current sources and the dynamic resistance circuit, and wherein the one or more control transistors are connected to one or more of a pulse shape control signal (e.g., SHAPE0 and SHAPE1, as illustrated in FIGS. 6 and 7) and a control signal (e.g., ON0 and ON1, as illustrated in FIGS. 6 and 7) that set the duration of the intermediate segment of the write pulse, set a slope of the trailing edge of the write pulse and set the current magnitude during the duration of the intermediate segment.

At least one of the pulse shape control signal (e.g., SHAPE0 and SHAPE1) and the control signal (e.g., ON0 and ON1) has a pulse shape based on one or more parameters of the set of parameters.

The driver circuitry can be part of an integrated circuit, such as that illustrated and described with reference to FIG. 15. The set of parameters can be stored on a programmable memory (e.g., the registers 1530 of FIG. 15) of the integrated circuit.

The write pulse driver can be configured to write to an array of programmable resistance memory cells (e.g., the array of memory cells 1502 as illustrated in FIG. 15) on the integrated circuit, and wherein one or more parameters of the set of parameters set the shape characteristics of the write pulse for a set operation (e.g., the waveform of the SET operation as illustrated in FIG. 4A) for the array of programmable resistance memory cells.

The one or more parameters can be selected based on an address of a memory cell (e.g., addresses 1528 as illustrated in FIG. 15) of the array of programmable resistance memory cells.

As described above, the write pulse driver can be configured to write to an array of programmable resistance memory cells on the integrated circuit. Further, one or more parameters of the set of parameters set the shape characteristics of the write pulse for a reset operation (e.g., the waveform of the RESET operation as illustrated in FIG. 4B) for the array of programmable resistance memory cells.

The one or more parameters can be selected for the write pulse for the reset operation based on an address of a memory cell (e.g., addresses 1528 as illustrated in FIG. 15) of the array of programmable resistance memory cells.

The write pulse driver can include an array of phase change memory cells (e.g., the array of memory cells 1502 as illustrated in FIG. 15, also illustrated in FIGS. 1A and 1B and described in accordance therewith) on the integrated circuit. One or more parameters of the set of parameters set the shape characteristics of the write pulse for one or both of a set operation and a reset operation (e.g., the waveform of the RESET operation as illustrated in FIG. 4B) for the array of phase change memory cells.

The circuits of the driver circuitry can include a quench control circuit, such as quench control 306 as illustrated in FIG. 3, coupled to the output node. Further, in responsive to a control signal, such as the QUENCH signal illustrated in FIG. 14B and described with reference thereto, the quench control circuit quenches a current produced by the write pulse on a bit line connected to the output node.

The above-described structures required and implemented by the write pulse driver can be implemented according to a method of controlling the write pulse driver.

Furthermore, in various implementations, a memory device can be provided. The memory device may provide the same structures and capabilities of the above-described write pulse driver. Specifically, the memory device can include the above-described driver circuitry and all of its variations as described with relation to the write pulse driver.

In addition to the driver circuitry and the variations thereof, the memory device can include a first block of memory cells and a second block of memory cells, such as the array of memory cells 1502 as illustrated in FIG. 15. Further, the memory device may include a parameter storage, as discussed above regarding the various implementations of the write pulse driver, storing a first set of parameters specifying characteristics of a first write pulse for the first block and a second set of parameters specifying characteristics of a second write pulse for the second block.

Similar to the above-described driver circuitry of the write pulse driver, the memory device can include driver circuitry configured to generate the first and second write pulses on output nodes coupled to bit lines (e.g., bit lines 1510 as illustrated in FIG. 15) in the first and second blocks, respectively, each of the first and second write pulses having a leading edge, a trailing edge and an intermediate segment between the leading edge and the trailing edge.

Further, similar to the above-described write pulse driver, the driver circuitry of the memory device can include circuits that set shape characteristics of at least one of an amplitude, a duration and a slope of one or more of the leading edge, the trailing edge and the intermediate segment of first write pulse applied to the bit lines in the first block using the first set of parameters, and similar to the above-described write pulse driver, the driver circuitry of the memory device can include circuits that set shape characteristics of at least one of an amplitude, a duration and a slope of one or more of the leading edge, the trailing edge and the intermediate segment of the second write pulse applied to the bit lines in the second block using the second set of parameters.

Further, referring to the above-described memory device, at least one of the first and second write pulses is a set pulse, as illustrated in FIG. 4A, for a phase change memory device as illustrated in FIGS. 1A and 1B.

Also, referring to the above-described memory device, at least one of the first and second write pulses is a reset pulse, as illustrated in FIG. 4B, for a phase change memory device as illustrated in FIGS. 1A and 1B.

The driver circuitry of the above-described memory device can include circuits (e.g., an initial control 302, a spike control 304, a write control0 308, a write current trim0 310, a write control1 312, a write current trim1 314 and a quench control 306) that set the shape characteristics of at least one of the amplitude, the duration and the slope of each of the leading edge, the trailing edge and the intermediate segment of the first write pulse for the first block using the first set of parameters and include circuits that set the shape characteristics of at least one of the amplitude, the duration and the slope of each of the leading edge, the trailing edge and the intermediate segment of the second write pulse for the second block using the second set of parameters.

Additionally, the circuits of the driver circuitry of the above-described memory device may include a current mirror having a control leg and an output leg connected to the output node (e.g., a bit line) as illustrated in FIG. 3, a first current source, such as the spike control portion 304 illustrated in FIG. 3 and further illustrated as element 500 in FIG. 5, source coupled to the control leg and configured to, responsive to a parameter of the first set of parameters, apply a first current to the control leg to control a first interval during the leading edge of the first write pulse for the first block. The circuits of the driver circuitry of the above-described memory device may also include a second current source coupled to the control leg and configured to, responsive to a parameter of the first set of parameters, apply a second current to the control leg to control a second interval during the intermediate segment of the first write pulse for the first block and at least a portion of a third interval during the trailing edge of the first write pulse for the first block.

The circuits of the driver circuitry of the above-described memory device may also include a third current source, such as the quench control 306 of FIG. 3, coupled to the output leg and configured to, responsive to one of a parameter of the first set of parameters and a signal, sink (e.g., pull down) a current output from the output leg of the current mirror during the trailing edge of the first write pulse for the first block.

Furthermore, the above-described first current source, which can be implemented as a spike control 304 as illustrated in FIG. 3, can set a current spike duration during the leading edge of the first write pulse of the first block (e.g., the adjustable SPIKE portion of the wave form illustrated in FIGS. 4A and 4B for the SET and RESET operations) based on a parameter of the first set of parameters.

The above-described second current source can be implemented, with reference to FIG. 3, as a write control0 308 and a current trim0 310 during the SET operation and can be implemented as a write control1 312 and a current trim1 314 during the RESET operation (also illustrated as a block diagram 600 of the current trim0 portion, write control0 800, and circuit 804 in FIGS. 6, 8A and 8B and illustrated as current trim1 700, write control1 900 and circuit 904 in FIGS. 7, 9A and 9B). The second current source can set a current magnitude and duration during the intermediate segment of the first write pulse for the first block (e.g., the current and duration adjustable FTOP portion of the waveform during the SET operation, as illustrated in FIG. 4A, and the current and duration adjustable RESET portion of the waveform during the RESET operation, as illustrated in FIG. 4B) based on a parameter of the first set of parameters.

The above-described third current source can be implemented as a quench control 306 as illustrated in FIG. 3. The third current source can quench a current magnitude during the trailing edge of the first write pulse for the first block (e.g., the rapid current pull-down of the waveform during the RESET operation, as illustrated in FIG. 4B) based on one of the parameters of the first set of parameters The write pulse driver can be implemented to write to an array of programmable resistance memory cells, such as the array of memory cells 1502 as illustrated in FIG. 15 and also as illustrated and described with reference to FIGS. 1A and 1B. Specifically, the driver circuitry can apply the write pulse (e.g., the waveforms illustrated in FIGS. 4A and 4B), as a first write pulse and a second write pulse to the array of programmable resistance memory cells. The first write pulse can be a set pulse, such as the waveform illustrated in FIG. 4A, for the array of programmable resistance memory cells. Moreover, the second write pulse is configured as a reset pulse, such as the waveform illustrated in FIG. 4B, for the array of programmable resistance memory cells.

In an implementation of the above-described memory device, each of the first and second blocks of memory cells includes an array of programmable resistance memory cells; the driver circuitry is configured to apply the first write pulse to the array of programmable resistance memory cells of the first block, and the second write pulse to the array of programmable resistance memory cells of the second block; the first write pulse is configured as a set pulse for the array of programmable resistance memory cells of the first block; the second write pulse is configured as a reset pulse for the array of programmable resistance memory cells of the second block; and the circuits of the driver circuitry further comprise a fourth current source coupled to the control leg and configured to, responsive to a parameter of the second set of parameters, apply a fourth current to the control leg to control the second interval during the intermediate segment of the second write pulse and at least a portion of the trailing edge of the second write pulse. The fourth current source can be implemented as the current trim1 314 and the write control 1 312 of FIG. 3 to control the second interval during the RESET portion and the end portion of the waveform of the RESET operation of FIG. 4B.

In an implementation of the above-described memory device, the first current source can be turned on during an ON state of a control signal, such as the SPIKE-ON signal illustrated in FIG. 5 and as further described in the timing charts of FIGS. 14A and 14B. Also, a parameter of the first set of parameters can set a duration of the ON state of the control signal (e.g., SPIKE-ON signal).

In an implementation of the above-described memory device, the second current source can be turned on during the intermediate segment (e.g., the FTOP and/or RESET portions of the waveforms) of the first write pulse for the first block, and includes a plurality of current sources (e.g., portions 602 and 702 of FIGS. 6 and 7) and a dynamic resistance circuit (e.g., portions 604 and 704 of FIGS. 6 and 7) configured to set a current magnitude and duration during the intermediate segment during the first write pulse for the first block. Also, a number of current sources of the plurality of current sources to be enabled during the intermediate segment of the first write pulse of the first block and a resistance of the dynamic resistance circuit are set using parameters of the first set of parameters.

In an implementation of the above-described memory device, the second current source can include one or more control transistors coupled, such as transistors 620, 622, 720 and 722 of FIGS. 6 and 7, between the plurality of current sources and the dynamic resistance circuit, wherein the one or more control transistors are connected to one or more of a pulse shape control signal (e.g., SHAPE0 and SHAPE1, as illustrated in FIGS. 6 and 7) and a control signal (e.g., ON0 and ON1, as illustrated in FIGS. 6 and 7) that sets the duration of the intermediate segment of the first write pulse for the first block, sets a slope of the trailing edge of the first write pulse for the first block and sets the current magnitude during the duration of the intermediate segment of the first write pulse for the first block.

In an implementation of the above-described memory device, at least one of the pulse shape control signal (e.g., SHAPE0 and SHAPE1) and the control signal (e.g., ON0 and ON1) has a pulse shape based on one or more parameters of the first set of parameters.

In an implementation of the above-described memory device, the driver circuitry can be part of an integrated circuit, such as that illustrated and described with reference to FIG. 15; and the first and second sets of parameters can be stored on a programmable memory (e.g., the registers 1530 of FIG. 15) of the integrated circuit.

In an implementation of the above-described memory device, each of the first and second blocks of memory cells includes an array of programmable resistance memory cells on the integrated circuit (e.g., the array of memory cells 1502 as illustrated in FIG. 15), wherein one or more parameters of the first set of parameters set the shape characteristics of the first write pulse for a set operation (e.g., the waveform of the SET operation as illustrated in FIG. 4A) for the array of programmable resistance memory cells of the first block.

In an implementation of the above-described memory device, the one or more parameters can be selected based on an address of a memory cell (e.g., addresses 1528 as illustrated in FIG. 15) of the array of programmable resistance memory cells of the first block.

In an implementation of the above-described memory device, each of the first and second blocks of memory cells includes an array of phase change memory cells on the integrated circuit. Further, one or more parameters of the first set of parameters set the shape characteristics of the first write pulse for a reset operation (e.g., the waveform of the RESET operation as illustrated in FIG. 4B) for the array of programmable resistance memory cells of the first block.

In an implementation of the above-described memory device, the one or more parameters of the first set of parameters can be selected based on an address of a memory cell (e.g., addresses 1528 as illustrated in FIG. 15) of the array of programmable resistance memory cells of the first block.

In an implementation of the above-described memory device, each of the first and second blocks of the memory cells includes an array of phase change memory cells on the integrated circuit (e.g., the array of memory cells 1502 as illustrated in FIG. 15, also illustrated in FIGS. 1A and 1B and described in accordance therewith), wherein one or more parameters of the first set of parameters set the shape characteristics of the first write pulse for one or both of a set operation and a reset operation (e.g., the waveform of the RESET operation as illustrated in FIG. 4B) for the array of phase change memory cells of the first block.

In an implementation of the above-described memory device, the driver circuitry can include a quench control circuit, such as quench control 306 as illustrated in FIG. 3, coupled to corresponding output nodes of the driver circuitry; and responsive to control signals, such as the QUENCH signal illustrated in FIG. 14B and described with reference thereto, the quench control circuit quenches a current produced by the write pulse on a bit line connected to the output nodes.

The above-described structures required and implemented by the above-described memory device can be implemented according to a method of controlling the memory device.

For example, an implementation of this method of controlling a memory device including first and second blocks of memory cells, including a parameter storage storing first and second sets of parameters, and including driver circuitry including an output node coupled to bit lines in the first and second blocks may include the following operations:

Obtaining, from the parameter storage, the first set of parameters specifying characteristics of a first write pulse for the first block, the first write pulse having a leading edge, a trailing edge and an intermediate segment between the leading edge and the trailing edge; obtaining, from the parameter storage, the second set of parameters specifying characteristics of a second write pulse for the second block, the second write pulse having a leading edge, a trailing edge and an intermediate segment between the leading edge and the trailing edge; setting shape characteristics of at least one of an amplitude, a duration and a slope of more than one of the leading edge, the trailing edge and the intermediate segment of the first write pulse applied to a bit line in the first block using the obtained first set of parameters; setting shape characteristics of at least one of an amplitude, a duration and a slope of more than one of the leading edge, the trailing edge and the intermediate segment of the second write pulse applied to bit lines in the second block using the obtained second set of parameters; generating the first write pulse on the output node using the set shape characteristics of the at least one of the amplitude, the duration and the slope of the more than one of the leading edge, the trailing edge and the intermediate segment; and generating a second write pulse on the output node using the set shape characteristics the at least one of the amplitude, the duration and the slope of the more than one of the leading edge, the trailing edge and the intermediate segment.

Additional implementations of the memory device and the driver circuitry thereof are not described in detail with reference to the figures, since such descriptions would be redundant to the above-listed descriptions of the driver circuitry of the write pulse driver. However, the memory device can be implemented using, but not limited to, all of the structures and capabilities thereof as described with reference to the write pulse driver.

The above-described structures required and implemented by the memory device can be implemented according to a method of controlling the memory device.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A write pulse driver, comprising:
a parameter storage, storing a set of parameters specifying characteristics of a write pulse; and
driver circuitry configured to generate the write pulse on an output node, the write pulse having a leading edge, a trailing edge and an intermediate segment between the leading edge and the trailing edge; and
wherein the driver circuitry includes pulse shaping circuits that set shape characteristics of at least one of an amplitude, a duration and a slope of more than one of the leading edge, the trailing edge and the intermediate segment of the write pulse using the set of parameters, wherein the pulse shaping circuits of the driver circuitry include:
a current mirror having a control leg and an output leg coupled to the output node;
a first current source coupled to the control leg and configured to, responsive to a parameter of the set of parameters, apply a first current to the control leg to control a first interval during the leading edge of the write pulse; and
a second current source coupled to the control leg and configured to, responsive to a parameter of the set of parameters, apply a second current to the control leg to control a second interval during the intermediate segment of the write pulse and at least a portion of a third interval during the trailing edge of the write pulse.

2. The write pulse driver of claim 1, wherein the write pulse is a set pulse for a phase change memory device.

3. The write pulse driver of claim 1, wherein the write pulse is a reset pulse for a phase change memory device.

4. The write pulse driver of claim 1, wherein the pulse shaping circuits of the driver circuitry set the shape characteristics of at least one of the amplitude, the duration and the slope of each of the leading edge, the trailing edge and the intermediate segment of the write pulse using the set of parameters.

5. The write pulse driver of claim 1, wherein the pulse shaping circuits of the driver circuitry further include a third current source coupled to the output leg and configured to, responsive to one of a parameter of the set of parameters and a signal, sink current output from the output leg of the current mirror during the trailing edge of the write pulse.

6. The write pulse driver of claim 5, wherein:
the first current source is configured to set a current spike duration during the leading edge of the write pulse based on a parameter of the set of parameters;
the second current source is configured to set a current magnitude and duration during the intermediate segment of the write pulse based on a parameter of the set of parameters; and
the third current source is configured to quench a current magnitude during the trailing edge of the write pulse based on the one of the parameters of the set of parameters and the signal.

7. The write pulse driver of claim 6, wherein:
the write pulse driver is configured to write to an array of programmable resistance memory cells;
the driver circuitry is configured to apply the write pulse, as a first write pulse, and a second write pulse to the array of programmable resistance memory cells;
the first write pulse is configured as a set pulse for the array of programmable resistance memory cells;
the second write pulse is configured as a reset pulse for the array of programmable resistance memory cells; and
the circuits of the driver circuitry further comprise a fourth current source coupled to the control leg and configured to, responsive to a parameter of the set of parameters, apply a fourth current to the control leg to control the second interval during an intermediate segment of the second write pulse and at least a portion of a trailing edge of the second write pulse.

8. The write pulse driver of claim 1, wherein:
the driver circuitry is part of an integrated circuit; and
the set of parameters is stored on a programmable memory of the integrated circuit.

9. The write pulse driver of claim 1, wherein:
the circuits of the driver circuitry include a quench control circuit coupled to the output node; and
responsive to a control signal, the quench control circuit quenches a current produced by the write pulse on a bit line connected to the output node.

10. A write pulse driver, comprising:
parameter registers storing a set of parameters specifying characteristics of a write pulse; and
driver circuitry connected with the parameter registers configured to generate the write pulse on an output node, the write pulse having a leading edge, a trailing edge and an intermediate segment between the leading edge and the trailing edge; and
wherein the driver circuitry includes pulse shaping circuits that set shape characteristics of at least one of an amplitude, a duration and a slope of more than one of the leading edge, the trailing edge and the intermediate segment of the write pulse using the set of parameters stored in the parameter registers, wherein the driver circuitry and parameter registers are on an integrated circuit comprising an addressable memory with memory cells having addresses, and the one or more parameters are selected based on an address of a memory cell in the addressable memory, and the one or more parameters stored for memory cells having addresses in one block or sub-block of the memory is/are different than the one or more parameters stored for memory cells having addresses in a different block or sub-block of the memory.

11. A method of producing a write pulse using a parameter storage storing parameters and driver circuitry configured to generate the write pulse, the write pulse having a leading edge, a trailing edge and an intermediate segment between the leading edge and the trailing edge, the method comprising:
obtaining a set of parameters specifying characteristics of a write pulse from the parameter storage;
setting shape characteristics of at least one of an amplitude, a duration and a slope of more than one of the leading edge, the trailing edge and the intermediate segment of the write pulse using the obtained set of parameters; and
generating the write pulse using the set shape characteristics of the at least one of the amplitude, the duration and the slope of the more than one of the leading edge, the trailing edge and the intermediate segment, including:
using a current mirror having a control leg and an output leg coupled to an output node;
using a first current source coupled to the control leg, responsive to a parameter of the set of parameters, to apply a first current to the control leg to control a first interval during the leading edge of the write pulse; and using a second current source coupled to the control leg, responsive to a parameter of the set of parameters, to apply a second current to the control leg to control a second interval during the intermediate segment of the write pulse and at least a portion of a third interval during the trailing edge of the write pulse.

12. The method of claim 11, wherein the write pulse is used for a phase change memory device.

13. The method of claim 11, including setting the shape characteristics of at least one of the amplitude, the duration and the slope of each of the leading edge, the trailing edge and the intermediate segment of the write pulse using the set of parameters.

14. The method of claim 11, including using a third current source coupled to the output leg and configured to, responsive to one of a parameter of the set of parameters and a signal, sink current output from the output leg of the current mirror during the trailing edge of the write pulse.

15. The method of claim 14, wherein:
the first current source is used to set a current spike duration during the leading edge of the write pulse based on a parameter of the set of parameters;
the second current source is used to set a current magnitude and duration during the intermediate segment of the write pulse based on a parameter of the set of parameters; and
the third current source is used to quench a current magnitude during the trailing edge of the write pulse based on the one of the parameters of the set of parameters and the signal.

16. The method of claim 11, including:
using the write pulses as a reset pulse for an array of programmable resistance memory cells; and
including using a current source coupled to the control leg to, responsive to a parameter of the set of parameters, apply a current to the control leg to control the second interval during an intermediate segment of the write pulse and at least a portion of a trailing edge of the write pulse.

17. The method of claim 11, including:
applying the write pulse to a memory cell, and responsive to a control signal, quenching a current produced by the write pulse on a bit line connected to the memory cell.

18. A method of producing a write pulse on an integrated circuit, the write pulse having a leading edge, a trailing edge and an intermediate segment between the leading edge and the trailing edge, the method comprising:
storing a set of parameters specifying characteristics of a write pulse in registers on the integrated circuit;
obtaining the set of parameters specifying characteristics of a write pulse from the registers on the integrated circuit;
setting shape characteristics of at least one of an amplitude, a duration and a slope of more than one of the leading edge, the trailing edge and the intermediate segment of the write pulse using the obtained set of parameters for a driver on the integrated circuit; and
generating with the driver, the write pulse using the set shape characteristics of the at least one of the amplitude, the duration and the slope of the more than one of the leading edge, the trailing edge and the intermediate segment, including:
applying the write pulse to an addressed memory cell, and selecting the one or more parameters based on the address, wherein the one or more parameters stored for memory cells having addresses in one block or sub-block of memory cells is/are different than the one or more parameters stored for memory cells having addresses in a different block or sub-block of memory cells.

* * * * *